United States Patent
Taniguchi

(10) Patent No.: US 6,317,195 B1
(45) Date of Patent: Nov. 13, 2001

(54) PROJECTION EXPOSURE APPARATUS

(75) Inventor: Tetsuo Taniguchi, Yokohama (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/185,101

(22) Filed: Nov. 3, 1998

Related U.S. Application Data

(60) Continuation of application No. 08/824,122, filed on Mar. 26, 1997, now abandoned, which is a division of application No. 08/582,019, filed on Jan. 2, 1996, now Pat. No. 5,721,608, which is a continuation of application No. 08/419,958, filed on Apr. 10, 1995, now abandoned, which is a continuation of application No. 08/223,658, filed on Apr. 6, 1994, now abandoned.

Foreign Application Priority Data

Apr. 8, 1993 (JP) ..................................... 5-79593

(51) Int. Cl.⁷ .......................... G03B 27/42; G03B 27/54; G03B 27/32
(52) U.S. Cl. .................. 355/53; 355/67; 355/77
(58) Field of Search .................. 355/53, 55, 67, 355/77; 362/257, 259, 263–265; 250/492.1, 492.22, 492.23; 359/618, 724, 196, 201, 202; 350/213–215

(56) References Cited

U.S. PATENT DOCUMENTS

| | | | |
|---|---|---|---|
| 4,558,949 | * 12/1985 | Uehara et al. | 356/152 |
| 4,650,983 | * 3/1987 | Suwa | 250/204 |

(List continued on next page.)

FOREIGN PATENT DOCUMENTS 63-33818   2/1988 (JP) .

OTHER PUBLICATIONS

Tracy, David H. et al., "Exposure Dose Control for Excimer Laser Lithography," 922 *SPIE Optical/Laser Microlithography*, 437–43 (1988).

Jain, Kanti, "Advances in Excimer Laser Lithography," 710 *SPIE Excimer Lasers and Optics*, 35–41 (1986).

Buckley, Jere D., "Expanding the Horizons of Optical Projection Lithography," *Solid State Technology*, 77–82 (May 1982).

*Primary Examiner*—Russell Adams
*Assistant Examiner*—Rodney Fuller
(74) *Attorney, Agent, or Firm*—Miles & Stockbridge P.C.

(57) ABSTRACT

A projection exposure apparatus has an illumination optical system for illuminating a mask, on which a predetermined pattern is formed, with light from a light source, a projection optical system for forming an image of the pattern of the mask on a photosensitive substrate, a mask stage for holding the mask and moving the mask within a plane perpendicular to the optical axis of the projection optical system, a substrate stage for moving the photosensitive substrate within a plane conjugate to the plane with respect to the projection optical system, and an imaging characteristic correction system for correcting an imaging characteristic of the projection optical system. The apparatus synchronously moves the mask and the photosensitive substrate along the optical axis of the projection optical system so as to expose the entire pattern surface of the mask. The apparatus includes an incident light intensity input system for inputting the intensity of the illumination light, which is incident on the projection optical system through the mask, in accordance with the position of the mask, and an imaging characteristic calculation device for calculating a variation in imaging characteristic of the projection optical system on the basis of information from the incident light intensity input system. The imaging characteristic correction system is controlled on the basis of a result obtained by the imaging characteristic calculation device.

95 Claims, 8 Drawing Sheets

U.S. PATENT DOCUMENTS

| | | | |
|---|---|---|---|
| 4,666,273 | * | 5/1987 | Shimizu et al. .................... 353/101 |
| 4,687,322 | * | 8/1987 | Tanimoto et al. .................... 355/55 |
| 4,780,747 | * | 10/1988 | Suzuki et al. ......................... 355/68 |
| 4,822,975 | * | 4/1989 | Torigoe ........................... 219/121.85 |
| 4,871,237 | * | 10/1989 | Anzai et al. ........................ 350/419 |
| 4,884,101 | * | 11/1989 | Tanimoto ............................... 355/68 |
| 4,920,505 | * | 4/1990 | Suzuki ................................ 364/525 |
| 4,924,257 | * | 5/1990 | Jain ...................................... 355/53 |
| 5,097,291 | * | 3/1992 | Suzuki .................................. 355/69 |
| 5,160,962 | * | 11/1992 | Miura et al. .......................... 355/53 |
| 5,194,893 | * | 3/1993 | Nishi ..................................... 355/53 |
| 5,227,839 | * | 7/1993 | Allen ..................................... 355/53 |
| 5,270,771 | * | 12/1993 | Sato ...................................... 355/53 |
| 5,281,996 | * | 1/1994 | Bruning et al. ....................... 355/77 |
| 5,291,240 | * | 3/1994 | Jain ....................................... 355/53 |
| 5,337,097 | * | 8/1994 | Suzuki et al. ......................... 355/53 |
| 5,343,270 | * | 8/1994 | Sakakibara et al. .................. 355/53 |
| 5,473,410 | * | 12/1995 | Nishi ..................................... 355/53 |
| 5,477,304 | * | 12/1995 | Nishi ..................................... 355/53 |
| 5,506,684 | * | 4/1996 | Ota et al. ............................ 356/401 |
| 5,591,958 | * | 1/1997 | Nishi et al. ......................... 250/205 |

* cited by examiner

PROJECTION EXPOSURE APPARATUS

CROSS-REFERENCE TO RELATED APPLICATIONS

This is a continuation of application Ser. No. 08/824,122 filed Mar. 26, 1997 (abandoned), which is a division of application Ser. No. 08/582,019 filed Jan. 2, 1996 (now U.S. Pat. No. 5,721,608), which is a continuation of application Ser. No. 08/419,958 filed Apr. 10, 1995 (abandoned), which is a continuation of application Ser. No. 08/223,658 filed Apr. 6, 1994 (abandoned).

BACKGROUND OF THE INVENTION

1. Field of the Invention

The present invention relates to a projection exposure apparatus and, more particularly, to a scan type projection exposure apparatus used to manufacture semiconductor integrated circuits and liquid crystal devices.

2. Related Background Art

Many conventional apparatuses of this type have correction functions for imaging characteristics because the apparatuses need to maintain high imaging characteristics. Factors which cause the imaging characteristics to vary are changes in external environment such as atmospheric pressure and temperature, and slight absorption of exposure light by a projection optical system. With regard to changes in environment, the atmospheric pressure and the like are monitored by sensors, and correction is performed in accordance with the detection values, as disclosed in, e.g., U.S. Pat. No. 4,687,322. With regard to absorption of exposure light, light energy incident on a projection optical system is measured, and a change in imaging characteristic owing to absorption of exposure light is calculated on the basis of the measurement value, thereby performing correction, as disclosed in, e.g., U.S. Pat. No. 4,666,273. In this known method, light energy incident on the projection optical system through a mask is detected by, e.g., a photoelectric sensor arranged on a substrate stage. In addition to light energy for projection exposure, which is incident from the mask side, light energy is incident on the projection optical system after it is reflected by a photosensitive substrate. This light energy also changes the imaging characteristics of the projection optical system depending on the intensity. With regard to such light energy, for example, as disclosed in U.S. Pat. No. 4,780,747, light reflected by a photosensitive substrate is measured by a photoelectric sensor arranged in an illumination optical system. The sensor receives the light through a projection optical system and a mask, and a total change in imaging characteristic is calculated in consideration of a change in imaging characteristic owing to this reflected light energy. In this method, light reflected by an optical member, a mask pattern, and the like is incident on the photoelectric sensor in the illumination optical system together with light reflected by the substrate. For this reason, a plurality of reference reflecting surfaces having different known reflectances are set on a substrate stage, and the ratio of the respective outputs from the photoelectric sensor, which correspond to the reference reflecting surfaces, is obtained in advance. The reflectance (more accurately, reflection intensity) of the photosensitive substrate is obtained on the basis of this ratio. As described above, since light reflected by a mask pattern is superposed on light reflected by a photosensitive substrate, sensor outputs corresponding to a plurality of reference reflecting surfaces must be obtained every time a mask is replaced. Alternatively, sensor outputs must be measured and registered in advance.

Conventionally, the amount of change in imagining characteristic owing to absorption of exposure light is obtained to perform correction by the above-described methods.

The above conventional scheme has been developed on the basis of a scheme of projecting/exposing the entire mask pattern on a photosensitive substrate (called a batch exposure scheme or a full field scheme). Recently, however, a so-called scan exposure scheme has been developed, in which exposure is performed by illuminating a portion of a pattern area on a mask with a slit-like beam while moving the mask and a photosensitive substrate relative to each other. In this scheme, since the illumination area on a mask is smaller than that in the batch exposure scheme, the amount of image distortion or illuminance irregularity is small. Furthermore, no limitations are imposed on the field size of a projection optical system in the scan direction, and hence large-area exposure can be performed.

In a scan type exposure apparatus, however, energy incident on the projection optical system changes while a mask is scanned with respect to a slit-like illumination beam. For example, such a change occurs because the area of a light-shielding portion (a chromium layer of a pattern) formed on a mask changes in accordance with the position of a slit illumination area on the mask, and hence the amount of energy incident on the projection optical system during a scan exposure operation changes.

In addition, the amount of light reflected by a mask pattern changes in accordance with the position of a mask. Therefore, the detection precision with respect to the amount of energy which is reflected by a photosensitive substrate and incident on the projection optical system inevitably deteriorates in the conventional scheme.

For the above-described reasons, in the conventional scheme, correction based on an accurate amount of change in imaging characteristic owing to absorption of exposure light cannot be performed.

SUMMARY OF THE INVENTION

It is an object of the present invention to provide a projection exposure apparatus of a scan exposure scheme, which can properly correct the imaging characteristics.

In order to achieve the above object, according to a first aspect of the present invention, there is provided a projection exposure apparatus having an illumination optical system for illuminating a mask, on which a predetermined pattern is formed, with light from a light source, a projection optical system for forming an image of the pattern of the mask on a photosensitive substrate, a mask stage for holding the mask and moving the mask within a plane perpendicular to an optical axis of the projection optical system, a substrate stage for moving the photosensitive substrate within a plane conjugate to the plane with respect to the projection optical system, and imaging characteristic correction means for correcting an imaging characteristic of the projection optical system, the apparatus synchronously moving the mask and the photosensitive substrate along an optical axis of the projection optical system so as to expose an entire pattern surface of the mask, and the apparatus including:

incident light intensity input means for inputting an intensity of the illumination light, which is incident on the projection optical system through the mask, in accordance with a position of the mask;

imaging characteristic calculation means for calculating a variation in imaging characteristic of the projection optical system on the basis of. information from the incident light intensity input means; and control means for controlling the imaging characteristic correction means on the basis of a result obtained by the imaging characteristic calculation means.

According to a second aspect of the present invention, there is provided a projection exposure apparatus having an illumination optical system for illuminating a mask, on which a predetermined pattern is formed, with light from a light source, a projection optical system for forming an image of the pattern of the mask on a photosensitive substrate, a mask stage for holding the mask and moving the mask within a plane perpendicular to an optical axis of the projection optical system, a substrate stage for moving the photosensitive substrate within a plane conjugate to the plane with respect to the projection optical system, and imaging characteristic correction means for correcting an imaging characteristic of the projection optical system, the apparatus synchronously moving the mask and the photosensitive substrate along an optical axis of the projection optical system so as to expose an entire pattern surface of the mask, and the apparatus including:

incident light intensity input means for inputting an intensity of the illumination light, which is incident on the projection optical system through the mask, in accordance with a position of the mask;

reflected light intensity input means for inputting an intensity of the illumination light, which is reflected by the photosensitive substrate and incident on the projection optical system again, in accordance with a position of the mask;

imaging characteristic calculation means for calculating a variation in imaging characteristic of the projection optical system on the basis of information from the incident light intensity input means and information from the reflected light intensity input means; and control means for controlling the imaging characteristic correction means on the basis of a result obtained by the imaging characteristic calculation means.

According to the present invention, even if energy incident on the projection optical system changes when a mask is scanned during an exposure operation, no problem is posed because illumination light intensity data corresponding to the position of the mask can be used for calculation of a variation in imaging characteristic caused by absorption of exposure light. In addition, according to the present invention, a variation in imaging characteristic owing to absorption of exposure light can be accurately obtained because energy incident on the projection optical system is calculated in consideration of information about light reflected by the photosensitive substrate.

As described above, according to the present invention, since a variation in imaging characteristic can be accurately calculated on the basis of the amount of energy incident on the projection optical system which changes in accordance with the position of a mask, the imaging characteristic can be corrected without any error even in a scan type exposure apparatus.

DESCRIPTION OF THE PREFERRED EMBODIMENTS

Figure 1:
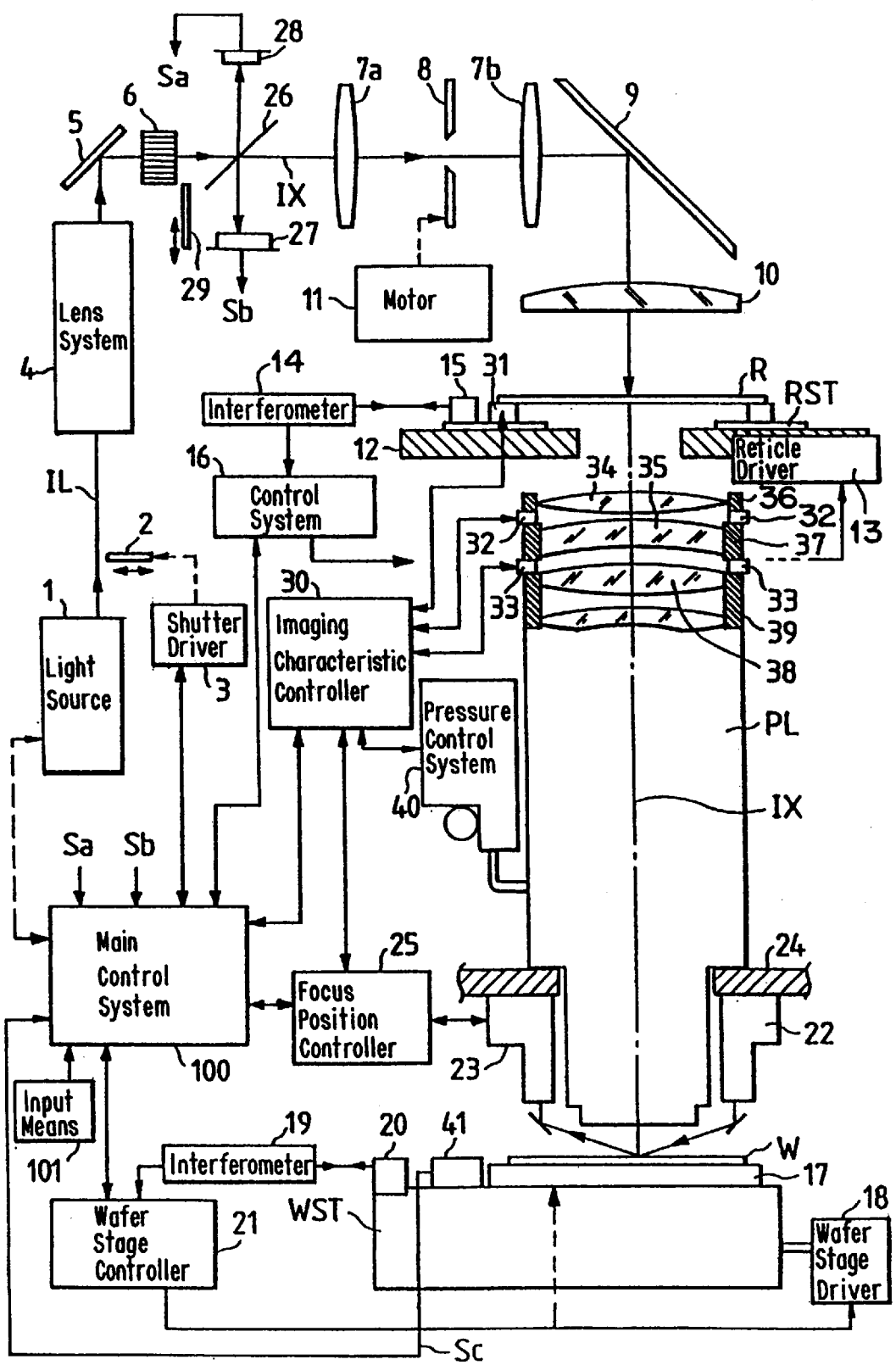
FIG. 1 is a schematic block diagram showing the arrangement of a scan type exposure apparatus according to an embodiment of the present invention.

An embodiment of the present invention will be described below with reference to the accompanying drawings. FIG. 1 is a schematic representation of the arrangement of a projection exposure apparatus suitable for an embodiment of the present invention. Illumination light IL emitted from a light source 1 passes through a shutter 2 and is adjusted to a predetermined beam diameter by a lens system 4 constituted by a collimator lens and the like. The illumination light IL is then incident on a fly-eye lens 6 through a mirror 5. The illumination light IL is an excimer laser beam such as a KrF or ArF laser beam, a harmonic wave of a copper vapor laser or a YAG laser, or an ultraviolet line from a super-high pressure mercury lamp. The shutter 2 is inserted/removed in/from an optical path by a shutter driver 3 to control opening/closing of the optical path. If the light source 1 is a pulse light source such as an excimer laser, the shutter 2 need not be used for light amount control.

The light beam emerging from the fly-eye lens 6 is incident on a reticle (mask) R, on which a semiconductor circuit pattern or the like is drawn, through relay lenses 7a and 7b, a reticle blind 8, a mirror 9, and a condenser lens 10. The system constituted by the fly-eye lens 6, the relay lenses 7a and 7b, the mirror 9, and the condenser lens 10 serves to superpose the illumination light IL emerging from the respective lens elements of the fly-eye lens 6 on the reticle R to illuminate the reticle R with a uniform light intensity. The light-shielding surface of the reticle blind 8 is conjugate to the pattern area of the reticle R. The size (slit width or the like) of the opening portion of the reticle blind 8 is adjusted by opening/closing a plurality of movable light-shielding portions (e.g., two L-shaped movable light-shielding portions) constituting the reticle blind 8 by using a motor 11. By adjusting the size of this opening portion, an illumination area IA for illuminating the reticle R is arbitrarily set. The reticle R is vacuum-chucked on a reticle stage RST disposed on a base 12. The reticle stage RST can be finely moved on the base 12 two-dimensionally through an air bearing and the like to position the reticle R within a plane perpendicular to an optical axis IX of the illumination system. The reticle stage RST can also be moved on the base 12 in a predetermined direction (scan direction) by a reticle driver 13 constituted by a linear motor and the like. The reticle stage RST has at least a moving stroke which allows the entire surface of the reticle R to cross the optical axis IX of the illumination system. A movable mirror 15 for reflecting a laser beam from an interferometer 14 is fixed to an end portion of the reticle stage RST. The position of the reticle stage RST in the scan direction is always detected by the interferometer 14 with a resolving power of about 0.01 μm. Position information about the reticle stage RST, which is obtained by the interferometer 14, is supplied to a control system 16. The control system 16 controls the reticle driver 13 to move the reticle stage RST on the basis of the position information about the reticle stage RST. The initial position of the reticle stage RST is determined such that the reticle R is positioned to a reference position with high precision by a reticle alignment system. Therefore, the position of the reticle R can be measured with sufficiently high precision by only measuring the position of the movable mirror 15 using the interferometer 14.

The illumination light IL passing through the reticle R is incident on, e.g., a double side telecentric projection optical system PL. The projection optical system PL then forms a projection image, obtained by reducing the circuit pattern of the reticle R to ⅕ or ¼, on a wafer W having a resist (photosensitive agent) coated on its surface.

Figure 2:
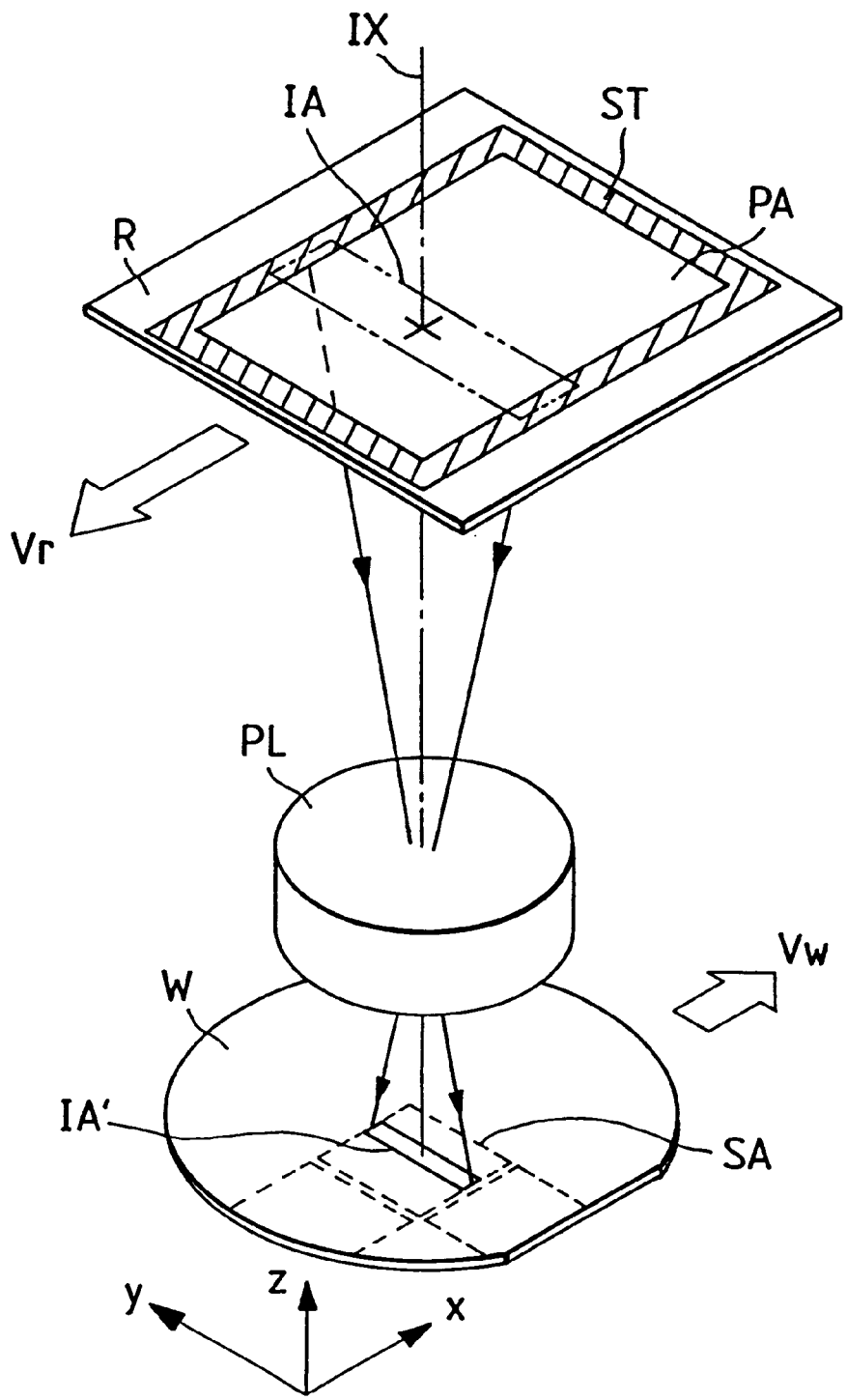
FIG. 2 is a perspective view showing a scan/exposure operation in the apparatus in FIG. 1.

In the exposure apparatus of this embodiment, as shown in FIG. 2, the reticle R is illuminated with the rectangular (slit-like) illumination area IA whose longitudinal direction is perpendicular to the reticle-side scan direction (+x direction), and the reticle R is scanned at a speed indicated by an arrow Vr in an exposure operation. The illumination area IA (whose center almost coincides with the optical axis IX) is projected on the wafer W through the projection optical system PL to form a projection area IA'. Since the wafer W and the reticle R have an inverted imaging relationship, the wafer W is scanned at a speed indicated by an arrow Vw in the opposite direction (−x direction) to the direction indicated by the arrow Vr in synchronism with the reticle R, thereby allowing the entire surface of a shot area SA of the wafer W to be exposed. A scan speed ratio Vw/Vr accurately corresponds to the reducing ratio of the projection optical system PL so that the-pattern of a pattern area PA of the reticle R can be accurately reduced/transferred onto the shot area SA. The longitudinal dimension of the illumination area IA is set to be larger than that of the pattern area PA and smaller than the maximum width of a light-shielding area ST. By scanning the illumination area IA, the entire surface of the pattern area PA can be illuminated.

Referring to FIG. 1 again, the wafer W is vacuum-chucked on a wafer holder 17 and held on a wafer stage WST through the wafer holder 17. The wafer holder 17 can be inclined in an arbitrary direction with respect to the optimum imaging plane of the projection optical system PL and can be finely moved along the optical axis IX (z direction) by a driver (not shown). In addition, the wafer stage WST is designed to be moved not only in the scan direction (x direction) but also in a direction (y direction) perpendicular to the scan direction to be arbitrarily moved to a plurality of shot areas so as to allow a step-and-scan operation. That is, the wafer stage WST repeats an operation of scanning/exposing a given shot area on the wafer W and an operation of moving to the next shot exposure start position. A wafer stage driver 18 constituted by a motor and the like serves to move the wafer stage WST in the X and y directions. A movable mirror 20 for reflecting a laser beam from an interferometer 19 is fixed to an end portion of the wafer stage WST. The X- and Y-positions of the wafer stage WST are always detected by the interferometer 19 with a resolving power of about 0.01 μm. Position information (or speed information) about the wafer stage WST is supplied to a wafer stage controller 21. The wafer stage controller 21 controls the wafer stage driver 18 on the basis of this position information (or speed information).

The wafer W which has been exposed and processed is aligned by a wafer alignment system (not shown) such that the projection image of the reticle is accurately superposed and exposed on the wafer W. A detailed description of this operation will be omitted.

In the apparatus shown in FIG. 1, an oblique incident type wafer position detection system (focus detection system) constituted by a radiation optical system 22 and a reception optical system 23 is fixed to a support portion (column) 24 for supporting the projection optical system PL. The radiation optical system 22 radiates an imaging light beam for forming a pinhole or a slit image onto the optimum imaging plane of the projection optical system PL from a direction oblique to the optical axis IX. The reception optical system 23 receives a light beam, of the imaging light beam, which is reflected by the surface of the wafer W through a slit. The arrangement and the like of this wafer position detection system are disclosed in, e.g., U.S. Pat. No. 4,650,983. The system is used to detect the positional deviation of the wafer surface in the vertical direction (z direction) with respect to the imaging plane so as to drive the wafer holder 17 in the z direction to keep a predetermined distance between the wafer W and the projection optical system PL. Wafer position information from the wafer position detection system is input to a focus position controller 25. This wafer position information is supplied to the wafer stage controller 21 through a main control system 100. The wafer stage controller 21 drives the wafer holder 17 in the z direction on the basis of the wafer position information.

Assume that in this embodiment, calibration of the wafer position detection system is performed in advance by adjusting the angle of a plane parallel glass (plane parallel) (not shown) arranged in the radiation optical system 22 such that the imaging plane becomes a zero reference. Alternatively, the inclination angle of a predetermined area on the wafer W with respect to the imaging plane may be detected by using a horizontal position detection system like the one disclosed in U.S. Pat. No. 4,558,949, or by designing a wafer position detection system to detect focus positions at a plurality of arbitrary positions in the image field of the projection optical system PL (e.g., by forming a plurality of slit images in the image field).

A radiation amount sensor 41 is disposed on the wafer stage WST at almost the same level as that of the surface of the wafer W. The radiation amount sensor 41 has a light-receiving surface which is at least larger than the projection area IA'. In measurement, the radiation amount sensor 41 is moved to a position immediately below the optical axis IX of the projection optical system PL, and outputs a signal Sc corresponding to the total intensity of illumination light passing through the reticle R. This signal Sc is used for initialization in correcting the imaging characteristics which vary upon incidence of illumination light, as will be described in detail later.

Figure 3:
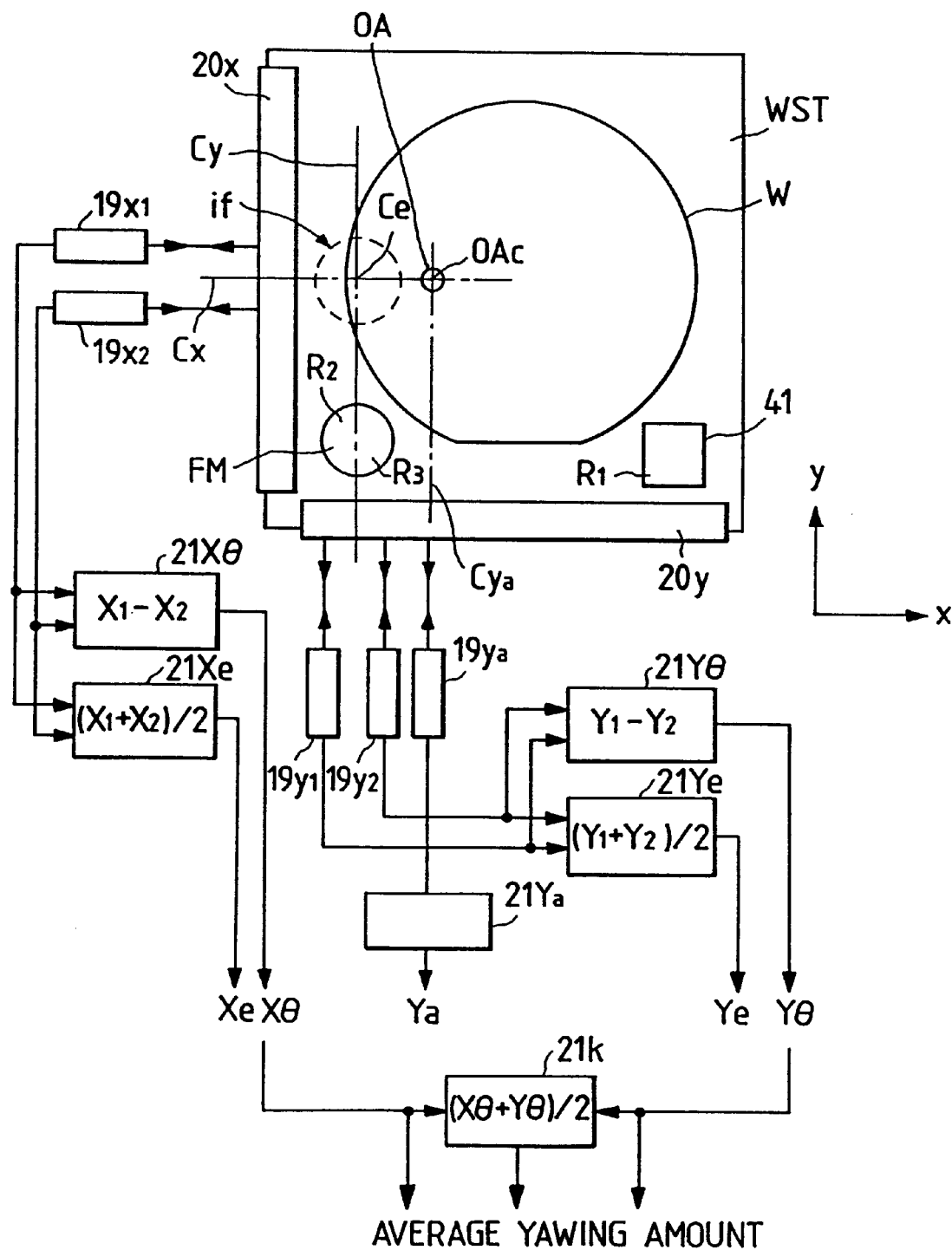
FIG. 3 is a block diagram showing the detailed arrangement of components around the wafer stage of the apparatus in FIG. 1.

The arrangement of the interferometer 19 will be described in detail below with reference to FIG. 3. FIG. 3 shows the detailed arrangement of components around the wafer stage WST. The interferometer 19 in this embodiment is constituted by five interferometers, i.e., X interferometers (interferometers $19x_1$ and $19x_2$) for measuring the X-position of the wafer stage WST, Y interferometers (interferometers $19y_1$ and $19y_2$) for measuring the Y-position of the wafer stage WST, and an alignment interferometer 19ya having an optical axis extending through a center OAc of an observation area OA of an off-axis alignment system (not shown) in the y direction. The interferometers $19x_1$ and $19x_2$ are arranged to be symmetrical with respect to a straight line Cx extending through a center Ce of a projection field if of the projection optical system PL in a direction parallel to the X axis. A movable mirror 20x is an X-position detection movable mirror for reflecting laser beams from the interferometers $19x_1$ and $19x_2$. The interferometers $19y_1$ and $19y_2$ are arranged to be symmetrical with respect to a straight line Cy extending through the center Ce of the projection field if of the projection optical system PL in a direction parallel to the Y axis. A movable mirror 20y is a Y-position detection movable mirror for reflecting laser beams from the interferometers $19y_1$ and $19y_2$. The wafer stage controller 21 incorporates a position calculator 21Xe for calculating an X-position, a yawing calculator 21Xθ for obtaining the yawing amount of the movable mirror 20x (wafer stage WST) from the Y-axis, a position calculator 21Ye for calculating a Y-position, a yawing calculator 21Yθ for obtaining the yawing amount of the movable mirror 20y (wafer stage WST) from the X-axis, and a position calculator 21Ya for calculating the Y-position of the off-axis alignment system at the center OAc. The position calculator 21Xe calculates an X-position measurement value Xe of the wafer stage WST on the basis of the average of measurement values obtained by the interferometers $19x_1$ and $19x_2$. The yawing calculator 21Xθ calculates a yawing amount Xθ in the movement of the wafer stage WST in the x direction on the basis of the difference between the measurement values obtained by the interferometers $19x_1$ and $19x_2$. The position calculator 21Ye calculates a Y-position measurement value Ye of the wafer stage WST on the basis of the average of measurement values obtained by the interferometers $19y_1$ and $19y_2$. The yawing calculator 21Yθ calculates a yawing amount Yθ in the movement of the wafer stage WST in the y direction on the basis of the difference between the measurement values obtained by the interferometers $19y_1$ and $19y_2$.

The position calculator 21Ya serves to measure a Y-position Ya of the wafer stage WST when a mark on the wafer W is to be detected by the off-axis alignment system. The alignment position measurement system (the interferometer 19ya and the position calculator 21Ya) is arranged to prevent an Abbe's error in a mark detecting operation which is caused when the observation center OAc of the off-axis alignment system is deviated from the center Ce of the projection field if of the projection optical system PL in the x direction. A reference plate FM having a reference mark formed thereon is arranged on the wafer stage WST. For example, the reference plate FM is used to measure the distance (baseline) between the observation center OAc of the off-axis alignment system and the center Ce of the projection field if of the projection optical system PL. The reference plate FM has a reflecting surface $R_2$ having a reflectance $r_2$, and a reflecting surface $R_3$ having an almost zero reflectance. The surface of the radiation amount sensor 41 has a reflecting surface $R_1$ having a reflectance $r_1$. The respective reflecting surfaces are used to obtain offset components or used as reference reflecting surfaces for calculating the reflectance of a wafer, as will be described later.

As shown in FIG. 3, the yawing amount of the wafer stage WST is independently measured by using both the X-axis movable mirror 20x and the Y-axis movable mirror 20y. In this measurement, an averaging circuit 21k is used to average the yawing amounts Xθ and Yθ measured by the two mirrors 20x and 20y. With this operation, variations in measurement value, obtained by the X-axis interferometers $19x_1$ and $19x_2$ and the Y-axis interferometers $19y_1$ and $19y_2$, owing to air fluctuations in the respective laser beam paths are averaged, allowing measurement of a yawing amount with higher reliability.

No significant problem is posed in the case of the wafer stage WST used for wafer exposure, as shown in FIG. 3. However, in the case of a stage for exposing a glass plate for the manufacture of a liquid crystal display element, the movement stroke of the stage may become extremely large in the X or y direction depending on the position of a projection image (pattern arrangement) on the glass plate. In this case, on the side where the movement stroke is extremely large, the laser beam path of one of a pair of interferometers for measuring yawing amounts may deviate from the movable mirror near the end point of the stroke. For this reason, it may be checked whether the laser beam path deviates from the movable mirror on the X- or Y-axis side depending on a pattern arrangement (which can be known in design prior to exposure), and a yawing amount measured by the interferometer on the axis side where the laser beam path does not deviate from the movable mirror may be selectively used. As is apparent, when the laser beam paths of the interferometers on the two axis sides do not deviate from the movable mirrors, an average yawing amount obtained by the averaging circuit 21k is preferably used.

A beam splitter 26 for reflecting part (e.g., 5%) of the illumination light IL and transmitting the remaining part, is arranged in the optical path between the fly-eye lens 6 and the reticle R in the apparatus shown in FIG. 1. The beam splitter 26 guides light reflected by the reticle R to a reflected light sensor 27. As the reflected light sensor 27, a photoelectric sensor such as a silicon photodiode or a photomultiplier is used. The reflected light sensor 27 receives light reflected by the wafer W through the reticle R and outputs a signal Sb to the main control system 100. Since it is preferable that the reflected light sensor 27 receive light reflected by the entire illumination area IA (IA'), the reflected light is preferably focused by a lens or the like, or the reflected light sensor 27 is preferably disposed at a Fourier transform plane corresponding to the wafer W, i.e., a position conjugate to the pupil position of the projection optical system PL.

The beam splitter 26 guides part of illumination light from the light source 1 to a photoelectric sensor 28 for detecting the intensity of a light beam from the light source 1. The photoelectric sensor 28 receives part of the illumination light IL reflected by the beam splitter 26 and outputs an output signal Sa to the main control system 100.

The functions of the reflected light sensor 27 and the photoelectric sensor 28 will be described in detail later.

The apparatus of this embodiment also includes an input means 101 such as a keyboard or a bar code reader and hence can input various information, e.g., thermal time constant information about the projection optical system, transmittance information about the reticle R, an illumination slit width, a target exposure amount, and a scan speed.

The exit end face of the fly-eye lens 6, on which a plurality of two-dimensional light source images are formed, has a relationship of Fourier transform with the pattern area of the reticle R. An aperture stop 29 for changing the shape of a two-dimensional light source is disposed near this exit end face. As the aperture stop 29, an annular aperture stop for limiting the shape of a two-dimensional light source image to an annular shape, an aperture stop for limiting the shape of a two-dimensional light source image to a plurality of discrete areas decentered from the optical axis IX, or a circular aperture stop for changing the size of a two-dimensional light source image without changing the position of the center may be used. Annular aperture stops are disclosed in Japanese Laid-Open Patent Application No. 61-91662 and the like. As an aperture stop for limiting the shape of a two-dimensional light source image, for example, an aperture stop having four opening portions arranged to be point symmetrical about the optical axis IX is disclosed in detail in Japanese Laid-Open Patent Application No. 4-225514.

The apparatus shown in FIG. 1 includes a correction mechanism for correcting the imaging characteristics of the projection optical system PL. This correction mechanism for imaging characteristics will be described below.

As shown in FIG. 1, in this embodiment, the optical characteristics of the projection optical system PL itself and its projection image imaging characteristics can be corrected by independently driving the reticle R and lens elements 34 and 35 using an imaging characteristic controller 30. The reticle stage RST can be finely moved along the optical axis IX (in the vertical direction) by driving elements 31. As the driving elements 31, piezoelectric elements, electrostrictive elements, or air dampers are used. Three or four driving elements 31 are used to drive the whole reticle stage RST.

Specifications of the imaging characteristics of the projection optical system PL (i.e., imaging characteristics of the image of a pattern of the reticle exposed to the wafer) include a focus position (imaging plane position), a projecting magnification, a distortion, a curvature of field, an astigmatism, and the like. These values can be independently corrected. In this embodiment, however, for the sake of a simple explanation, correction of a focus position, a projecting magnification, and a curvature of field in the double side telecentric projection optical system will be described below with reference to a method of driving the lens elements of the projection optical system PL.

The first group lens element 34 located nearest to the reticle R is fixed to a support member 36, and the second group lens element 35 is fixed to a support member 37. A lens element below a lens element 38 is fixed to a mirror barrel portion 39 of the projection optical system PL. Assume that in this embodiment, the optical axis IX of the projection optical system PL is the optical axis of the lens element fixed to the mirror barrel portion 39.

The support member 36 is coupled to the support member 37 through a plurality of (e.g., three; two are shown in FIG. 1) extendible driving elements 32. The support member 37 is coupled to the mirror barrel portion 39 through a plurality of extendible driving elements 33.

In this arrangement, when the lens elements 34 and 35 are translated along the optical axis, a projecting magnification (the enlargement/reduction amount of the size of a projection image) M, a curvature of field C, and a focus position F slightly change in amount at change rates corresponding to the moving amounts. Letting $z_1$ be the driving amount of the lens element 34 and $z_2$ be the driving amount of the lens element 35, variations $\Delta M$, $\Delta C$, and $\Delta F$ of the projecting magnification M, the curvature of field C, and the focus position F are expressed by the following equations, respectively:

$$\Delta M = C_{M1} \times z_1 + C_{M2} \times z_2 \tag{1}$$

$$\Delta C = C_{C1} \times z_1 + C_{C2} \times z_2 \tag{2}$$

$$\Delta F = C_{F1} \times z_1 + C_{F2} \times z_2 \tag{3}$$

where $C_{M1}$, $C_{M2}$, $C_{C1}$, $C_{C2}$, $C_{F1}$, and $C_{F2}$ are constants representing the change rates of variations with respect to the driving amounts of the respective lens elements.

As described above, the wafer position detection systems 22 and 23 serve to detect the shift amount of a wafer surface with respect to the optimum focus position, of the projection optical system PL, which serves as a zero reference. Therefore, when a proper offset amount $z_3$ is electrically or optically given to the wafer position detection systems 22 and 23, a focus position shift caused upon driving of the lens elements 34 and 35 can be corrected by positioning the wafer surface using the wafer position detection systems 22 and 23. In this case, equation (3) is rewritten as follows:

$$\Delta F = C_{F1} \times z_1 + C_{F2} \times z_2 + z_3 \tag{4}$$

As described above, the variations $\Delta M$, $\Delta C$, and $\Delta F$ can be arbitrarily corrected by setting the driving amounts $z_1$ to $z_3$ according to equations (1), (2), and (4). In this case, three types of imaging characteristics are simultaneously corrected. If, however, the variation in imaging characteristic, of the optical characteristics of the projection optical system, which is caused by absorption of illumination light is negligible, the corresponding correction described above need not be performed. In addition, in this embodiment, if an imaging characteristic other than the three types of imaging characteristics described above greatly changes, correction must be performed with respect to that imaging characteristic. In this embodiment, since the variation in curvature of field is corrected to zero or an allowable value or less, no special correction of this astigmatism is performed.

In the embodiment, the variation $\Delta F$ in focus position (equation (4)) is corrected as follows. For example, a proper offset amount is electrically or optically (using a plane parallel) given to the wafer position detection systems 22 and 23, and the wafer W is moved in the z direction by using the wafer position detection systems 22 and 23, thereby setting the surface of the wafer W at the optimum imaging plane (best focus position) of the projection optical system PL.

In this embodiment, the reticle R and the lens elements 34 and 35 are moved along the optical axis by the imaging characteristic controller 30. Especially the lens elements 34 and 35 greatly influence the respective characteristics associated with magnification, distortion, and curvature of field (astigmatism) and can be easily controlled, as compared with other lens elements. In this embodiment, the two groups of movable lens elements are arranged. However, three or more groups of lens elements may be arranged. In this case, the moving range of each lens element can be broadened while variations in other aberrations are suppressed. In addition, this arrangement can properly cope with various types of distortions (trapezoidal and rhombic distortions) and a curvature of field (astigmatism). Furthermore, distortions and the like can be corrected by driving the reticle R in the z direction.

Feedback control is also performed with respect to a predetermined target position by using position sensors for monitoring driving amounts, e.g., encoders, capacitive sensors, and reflection type sensors. When the above mechanism is to be used only for maintenance, even if dynamic correction is not performed during an exposure operation, the mechanism may be replaced with a fine feed mechanism with a micrometer head or a semi-stationary mechanism with a washer.

In the above imaging characteristic correction mechanism, correction is performed by moving the reticle R and the elements. However, this embodiment may use any proper correction mechanism of a different scheme other than that described above. For example, the following method may be used. A space defined by two lens elements or plane parallel glasses is sealed, and the pressure in the sealed space is adjusted. The apparatus shown in FIG. 1 includes a pressure control system 40 for adjusting the pressure in the sealed space defined by the lens elements so as to finely correct the optical characteristics (especially the magnification) of the projection optical system PL itself. The pressure control system 40 is also controlled by the imaging characteristic controller 30 to provide desired imaging characteristics for a projection image. Since the detailed arrangement of the pressure control system 40 is disclosed in U.S. Pat. No. 4,871,237, a description thereof will be omitted.

As described above, variations in the imaging characteristics of the projection optical system PL owing to absorption of exposure light can be satisfactorily corrected by driving the lens elements or using the correction mechanism for adjusting the pressure in the sealed space defined by the lens elements.

A method of calculating a variation in imaging characteristic owing to absorption of exposure light will be described next. The above-described imaging characteristic correction mechanism is optimally driven on the basis of the calculated variation in imaging characteristic. Strictly speaking, variations in the above imaging characteristics need to be separately calculated. This is because the degrees to which the respective imaging characteristics are influenced slightly differ from each other depending on the lens elements constituting the projection optical system PL, and hence variation characteristics differ even if illumination light having the same energy is incident on the projection optical system PL. However, the basic calculation methods are the same, but the coefficients used in the calculations of the respective characteristics are slightly different from each other. Therefore, for the sake of simplicity, the following description is made with reference to the variation $\Delta M$ in projecting magnification.

Figure 4A:
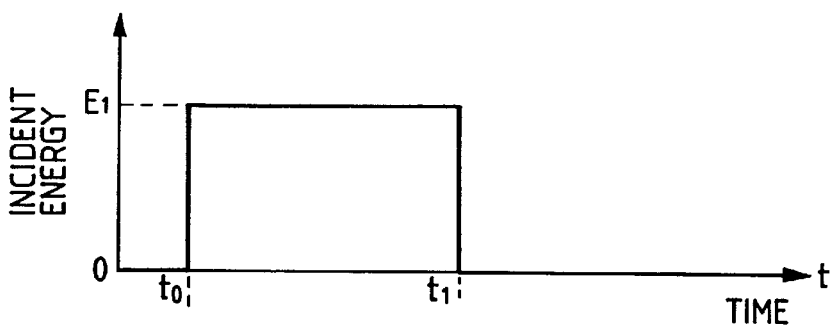
FIG. 4A is a graph showing incident energy.
Figure 4B:
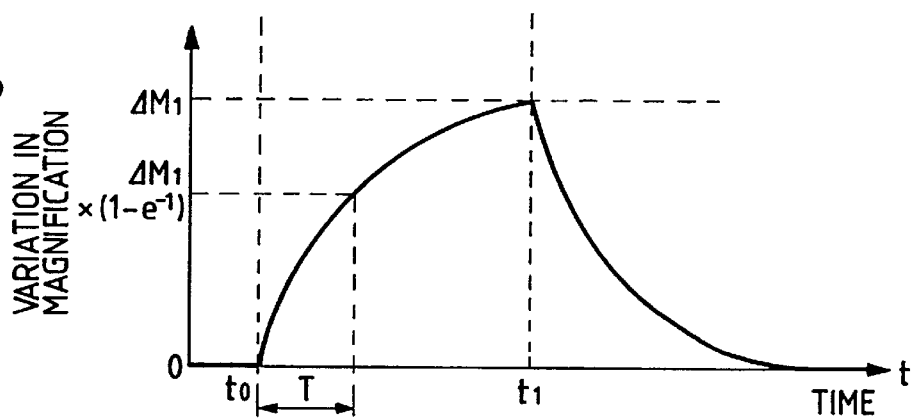
FIG. 4B is a graph showing the relationship between the incident energy and the variation in magnification.

The principle of the method will be described first. The variation $\Delta M$ in projecting magnification is caused because the refractive indexes or curvatures of the lens elements in the projection optical system PL slightly change when the lens elements slightly absorb illumination light and increase in temperature. Consider one lens element. Energy of illumination light is input to the lens element, i.e., heat is absorbed thereby, and at the same time, heat is dissipated to external components such as the mirror barrel portion 39. The temperature of the lens element is determined by the balance between the absorption and dissipation of heat. Providing that the temperature rise and the variation $\Delta M$ in magnification are proportional to each other, it can be considered that the variation $\Delta M$ in magnification is determined by the heat balance. In general, when the temperature of the lens element is low, absorption of heat is higher in rate than dissipation of heat, and hence the temperature gradually increases. When the temperature of the lens element becomes high as compared with the ambient temperature, dissipation of heat becomes higher in rate than absorption of heat. When the absorption of heat balances the dissipation of heat, the lens element reaches a saturation level to be set in an equilibrium state. If an exposure operation is stopped, heat is gradually dissipated, and the temperature of the lens element decreases. When the difference between the temperature of the lens element and the ambient temperature becomes small, the speed of heat dissipation decreases. This characteristic is generally called a first-order time-lag, which can be expressed by a first-order differential equation. FIGS. 4A and 4B show this state. FIG. 4A shows incident energy. FIG. 4B shows a magnification variation characteristic obtained when illumination light of a predetermined energy amount is radiated on the projection optical system PL for a predetermined period of time. The variation characteristic shown in FIG. 4B indicates a final variation $\Delta M_1$ (saturation level) in projecting magnification with respect to radiation energy $E_1$. The variation $\Delta M_1$ in projecting magnification can be determined by two values, i.e., a change rate $\Delta M_1/E_1$ and a time constant T representing a change over time. Referring to FIG. 4B, the time constant T can be defined as a time during which the magnification changes by $\Delta M_1 \times (1-e^{-1})$ with respect to the final variation $\Delta M_1$. In this case, when the change rate $\Delta M_1/E_1$ and the time constant T are obtained, the variation M in magnification can be calculated from an estimated value of the energy E which is incident on the projection optical system PL in accordance with the output Sa from the photoelectric sensor 28. More specifically, by always monitoring the incident energy E, the variation $\Delta M$ can be sequentially calculated in the main control system 100 on the basis of the change rate $\Delta M_1/E_1$ and the time constant T. The change rate $\Delta M_1/E_1$ and the time constant T can be obtained by checking a characteristic like the curve shown in FIG. 4B while experimentally keeping radiating illumination light on the projection optical system PL. In practice, however, since a plurality of lens elements are present in the projection optical system PL, the overall magnification variation characteristic is expressed by the sum of several first-order time-lag characteristics. The change rate $\Delta M_1/E_1$ and the time constant T are input to the main control system 100 through the input means 101. As described above, the change rate $\Delta M_1/E_1$ and the time constant T are coefficients of a first-order differential equation. This differential equation is sequentially solved by numerical analysis using a general digital calculator or the like. In this case, if calculation synchronization is performed at predetermined time intervals sufficiently shorter than the time constant T, and the value of the energy E incident on the projection optical system PL is sequentially obtained (calculated) in accordance with this calculation synchronization, the $\Delta M$ at a given time point can be calculated by the main control system 100.

A method of obtaining different values of the incident energy E in accordance with the position of a reticle and obtaining the variation characteristic of an imaging characteristic in a case wherein the energy amount changes during an exposure operation for one shot will be described below.

A method of obtaining the energy E sequentially radiated on the projection optical system PL will be described below. When energy incident on the projection optical system PL is to be considered, the amount of light which is reflected by a wafer and incident on the projection optical system again must be considered in addition to the amount of light which is incident on the projection optical system PL through a reticle. In a scan type apparatus, since the reticle R is scanned with respect to the slit-like illumination area IA (i.e., the optical axis of the projection optical system), the total area of the light-shielding portion of the reticle R sequentially changes in accordance with the scan position, and the energy E incident on the projection optical system PL changes in amount in accordance with the scan position of the reticle. For this reason, the incident energy E may be calculated by obtaining the sum of the amount of light which is incident on the projection optical system PL through the reticle and the amount of light which is reflected by the wafer and incident on the projection optical system PL again, at time intervals $\Delta t$ of, e.g., several msec as sampling time intervals.

In this case, the amount of light which is incident on the projection optical system PL through the reticle is obtained on the basis of the output Sa from the photoelectric sensor 28, and the amount of light which is reflected by the wafer and incident on the projection optical system PL again is obtained on the basis of the output Sb from the reflected light sensor 27. However, the output Sb from the reflected light sensor 27 includes light amount information about light reflected by the reticle R and optical members in the illumination optical system. For this reason, in this embodiment, reference reflection plates having different known reflectances are used, and reference reflection data for obtaining the reflection intensity of the wafer are obtained in accordance with the scan position of the reticle. The actual reflectance (reflection intensity) of the wafer is then obtained in accordance with the scan position of the reticle on the basis of the reference reflection data. In addition, the transmittance (transmitted light amount) of the reticle is obtained in accordance with the scan position of the reticle, and the energy E is obtained on the basis of these pieces of information.

A method of obtaining the incident energy E by using the wafer reflectance and the transmittance of the reticle which are obtained on the basis of the reference reflection data will be described next. Letting P be the amount of light which is incident on the projection optical system PL through the reticle R, and r be the reflectance of the wafer W, the total amount of light incident on the projection optical system PL, including an amount P·r of light which is reflected by the wafer W and incident on the projection optical system PL, can be expressed by equation (5):

$$E = P \times (1 + r) \qquad (5)$$

Letting $\eta$ be the transmittance of the reticle R at the radiation position, Ip be the illuminance of a light source per unit area, and S be the radiation area, the light amount P can be expressed as follows:

$$P = Ip \times S \times \eta \qquad (6)$$

In this case, the illuminance Ip is the illuminance (without a reticle) on the wafer W per unit area, and the area S is the area of the projection area IA' of the wafer W for the sake of convenience. Since it is essential to obtain the relationship between the variation $\Delta M$ and the energy E, the light amount P may be defined on the reticle R or any other places.

In performing a scan type exposure operation, since the amount of light which is incident on the projection optical system PL through the reticle R changes in accordance with the position of the reticle R, the reticle transmittance $\eta$ must be obtained for each scan position of the reticle R. A method of obtaining the transmittance of a reticle will be described below.

After the wafer stage WST is moved such that the radiation amount sensor 41 is located in the projection area IA', only the reticle stage RST is scanned while the wafer stage WST is fixed and the reticle R is placed on the reticle stage RST. At this time, the magnitude of an output $Sc_1$ from the radiation amount sensor 41 is sequentially read in correspondence with the coordinate position ($x_R$) of the interferometer 14 for measuring the position of the reticle stage RST. Similarly, the magnitude of the output Sa from the photoelectric sensor 28 is read. A ratio $Sc_1/Sa$ is then calculated and stored in a memory in the main control system 100 in correspondence with each coordinate position. For example, storage of such data in the memory (digital sampling) may be performed at intervals corresponding to a predetermined moving amount (e.g., 0.01 $\mu$m to 10 $\mu$m) with reference to the resolving power (e.g., 0.01 $\mu$m) of the interferometer 14. In general, the main control system 100 is constituted by a digital computer. For this reason, in practice, several digital values of the ratio $Sc_1/Sa$, which are sequentially calculated with a resolving power almost equal to the resolving power of the interferometer 14, may be averaged, and such average values may be stored at position intervals (or time intervals) at which no problem is posed in terms of an error in the calculation precision of a variation in magnification. Alternatively, the values of the ratio $Sc_1/Sa$, which are sequentially calculated with a resolving power almost equal to the resolving power of the interferometer 14 (or a predetermined moving amount larger than that thereof).

Note that the position where the reticle stage RST starts to move so as to read the output $Sc_1$ is stored, as a reference position for a read operation, in the main control system 100. An output $Sc_2$ from the radiation amount sensor 41, reticle transmittance data $\eta(x_R)$, the output Sb from the reflected light sensor 27, reference reflectance data $rx(x_R)$, and offset component data, which output and data will be described later, are all stored in the memory with reference to this position.

Figure 5:
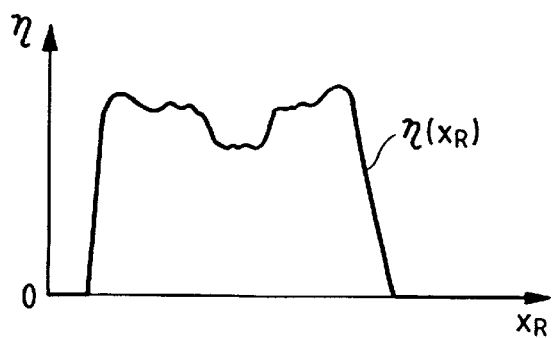
FIG. 5 is a graph showing a change in reticle transmittance in a case wherein the reticle is moved.

A ratio $Sc_2/Sa'$ (a constant value independent of the scan position) between the output $Sc_2$ from the radiation amount sensor 41 and the output Sa from the photoelectric sensor 28, which are detected at the same timing before the reticle R is mounted on the reticle stage RST, is determined, and the data string (waveform) of the ratio $Sc_1/Sa$ stored in the memory is normalized (divided) by using the value of the $Sc_2/Sa'$ as a denominator. With this operation, the data string of a ratio $Sc_1 \cdot Sa'/Sc_2 \cdot Sa$ output from the radiation amount sensor 41 in correspondence with the presence/absence of the reticle R is obtained. The data string of this ratio is stored in the memory at the same intervals as the digital sampling intervals for the output $Sc_1$. This output ratio $Sc_1 \cdot Sa'/Sc_2 \cdot Sa$ is the true reticle transmittance $\eta$ obtained by correcting a detection error due to fluctuations in the illuminance Ip. Since the transmittance $\eta$ is a function of the position $x_R$, it can be expressed as $\eta(x_R)$. For example, this function can be expressed by the curve shown in FIG. 5. Referring to FIG. 5, the abscissa indicates the position $x_R$ of the reticle in the x direction (scan direction); and the ordinate, represents the reticle transmittance $\eta$. Since the position $x_R$ changes with time t during a scan operation, $\eta(x_R) = \eta(t)$, provided that the scan operation is performed at a constant speed. The illuminance Ip is a factor which varies with time. For this reason, in an actual scan/exposure operation, equation (6) is modified to equation (7), and the illuminance Ip during the scan/exposure operation is sequentially obtained from the output Sa from the photoelectric sensor 28 and substituted into equation (7):

$$P(t) = S = \eta(t) \times Ip(t) \qquad (7)$$

$$\eta(t) = \eta(x_R)$$

If the illuminance Ip does not change with time (for example, if a mercury discharge lamp or the like is used as a light source), a variation in the illuminance Ip during an exposure operation with respect to one shot area on the wafer W can almost be neglected. Therefore, the illuminance Ip may be detected on the basis of the output Sa from the photoelectric sensor 28 and stored immediately before a scan/exposure operation is started, and Ip(t) can be used as a constant in calculating equation (7). In this case, the illuminance Ip may be treated as a constant value when the shutter is turned on by a shutter ON/OFF signal, whereas the illuminance Ip may be treated as Ip=0 when the shutter is turned off. In addition, since an output from the radiation amount sensor 41 indicates the incident light amount P(t), the incident light amount P(t) measured before an exposure operation can be used without registering η(t) for each reticle in advance. In any case, since the time t in equation (7) uniquely corresponds to the scan position of the reticle (or the wafer), the incident light amount P(t) is obtained in real time by reading out the transmittance data $\eta(x_R)$ from the memory in accordance with the measurement position $x_R$ of the interferometer 14.

Furthermore, since the radiation amount sensor 41 is allowed to have a small light-receiving area as compared with a batch exposure type sensor for illuminating the entire reticle surface at once, an inexpensive, uniform sensor (a silicon photodiode or the like) having almost no illuminance irregularity on the light-receiving surface can be used as the radiation amount sensor 41. If the light source 1 is a pulse light source, the radiation amount sensor 41 receives pulse light. In this case, the radiation amount sensor 41 may measure the intensity of each pulse triggered in accordance with the scan position of the reticle R, and the resulting output Sc may be sequentially loaded as the illuminance Ip. Alternatively, the intensities of pulse light (one or a plurality of pulses) triggered in a predetermined short period of time, e.g., several to several tens of msec may be accumulated, and the average illuminance Ip for each period time may be sequentially loaded.

A method of obtaining the reflectance r in equation (5) will be described next.

As described above, in addition to light reflected by the wafer W surface, light reflected by the reticle R surface or each lens element of the projection optical system PL is incident on the reflected light sensor 27. For this reason, the actual wafer reflectance is calculated in accordance with reference reflection data prepared by using reference reflecting surfaces on the wafer stage WST. Assume that the surface of the radiation amount sensor 41 is the reflecting surface $R_1$ having the known reflectance $r_1$, and the surface of the reference plate FM is the reflecting surface $R_2$ having the known reflectance $r_2$. The reflectances $r_1$ and $r_2$ ($r_1>0$; $r_2>0$) corresponding to illumination light for exposure at two reference reflecting surfaces are known values measured in advance, and it is preferable that the two reflectances $r_1$ and $r_2$ be greatly different from each other. First, the wafer stage WST is moved such that the reflecting surface $R_1$ is located within the projected radiation area IA' while the reticle R is set. The reticle stage RST is then moved at a predetermined speed while the wafer stage WST is at rest. With this operation, the magnitude of an output $I_1$ from the reflected light sensor 27 is digitally sampled for each scan position of the reticle R, and the sampled data are sequentially stored in the memory of the main control system 100 in correspondence with the respective scan positions. Digital sampling and storage in the memory may be performed at intervals corresponding to a predetermined moving amount with reference to, e.g., the resolving power (e.g., 0.01 μm) of the interferometer 14. In this case, the digital sampling interval need not coincide with the resolving power of the interferometer 14 and may be larger than that, e.g., 0.2 μm to 10 μm.

Subsequently, the wafer stage WST is moved such that the reflecting surface $R_2$ having the reflectance $r_2$ is located within the radiation area IA'. The reticle stage RST is then moved at a predetermined speed while the wafer stage WST is at rest. With this operation, the magnitude of an output $I_2$ from the reflected light sensor 27 is sequentially stored (digitally sampled) in the memory of the main control system 100 in accordance with each position of the reticle R. In this case, the timing of storage in the memory is set to be equal to the digital sampling interval for the output $I_1$, and addresses in the memory are set so that the sampling positions of the outputs $I_1$ uniquely correspond to those of the outputs $I_2$.

Especially when the light source 1 is a pulse light source, the values of the outputs $I_1$ and $I_2$ must be normalized ($I_1$/Sa; $I_2$/Sa) by using the output Sa from the photoelectric sensor 28 to correct an intensity variation of each pulse. This equally applies to the case wherein an ultraviolet line from a mercury discharge lamp is used as illumination light. The normalized values $I_1$/Sa and $I_2$/Sa are stored in the memory.

Figure 6:
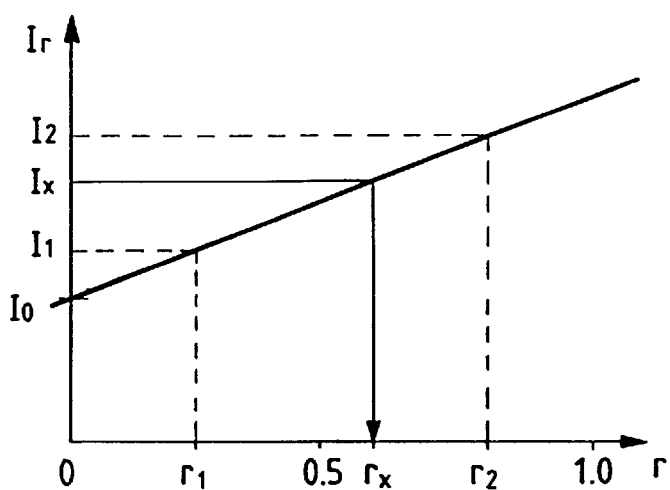
FIG. 6 is a graph showing the relationship between the reflectance and the reference reflectances.

FIG. 6 shows the relationship between the output of light reflected by each reference reflecting surface and the reflectance. Referring to FIG. 6, the values $I_1$ and $I_2$ (or $I_1$/Sa and $I_2$/sa) sampled when the reticle R is moved to a given scan position are plotted along the ordinate, and the reflectance is plotted along the abscissa. As shown in FIG. 6, by drawing a straight line passing coordinates ($r_1,I_1$) and ($r_2,I_2$), a reflectance (more accurately, reflection intensity) rx of the wafer can be obtained from an output value from the reflected light sensor 27 which is obtained at this scan position. That is, if the output from the reflected light sensor 27, obtained when the reticle R is moved to the scan position during an actual exposure operation, is represented by Ix, the wafer reflectance rx at this time can be calculated according to the following equation by reading out the values $I_1$ and $I_2$ as the reference reflection data in the memory which correspond to the scan position.

$$rx=[(r_2-r_1)/(I_2-I_1)]\times(Ix-I_1)+r_1 \qquad (8)$$

For example, a method of using three reference reflecting surfaces having different reflectances and obtaining the straight line shown in FIG. 6 from three measurement points by the least square approximation may be used. In this case, the area of each reference reflecting surface is allowed to be small as compared with a batch type sensor. When the reflected light sensor 27 is to receive pulse light, the intensity of each pulse may be measured, or power may be accumulated for a predetermined short period of time, e.g., several to several tens of msec, so as to be output as average power. In any case, the data strings of the outputs $I_1$ and $I_2$ are stored in the memory before an actual exposure operation. Alternatively, equation (8) may be prepared as reference reflection data at each scan position (sampling position) of the reticle R and stored in the memory. As is apparent, when the outputs $I_1$ and $I_2$ are normalized by using the output Sa, the output Ix from the reflected light sensor 27, used to obtain the actual wafer reflectance rx, is also normalized by using the output Sa and substituted into equation (8).

Figure 7A:
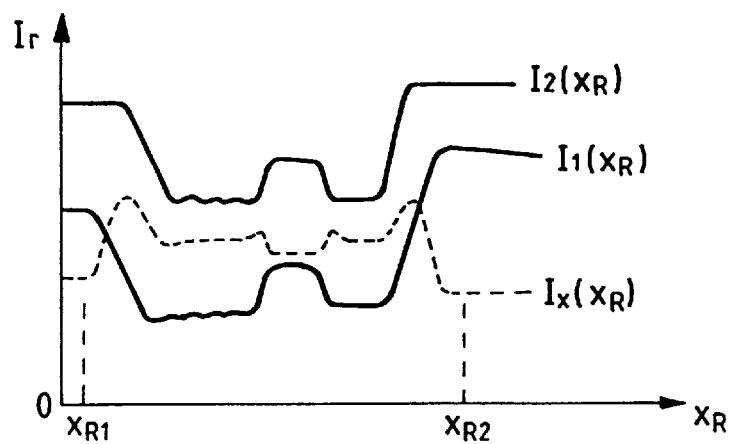
FIG. 7A is a graph showing the relationship between the reflectance and the reference reflectances in a case wherein the reticle is moved.
Figure 7B:
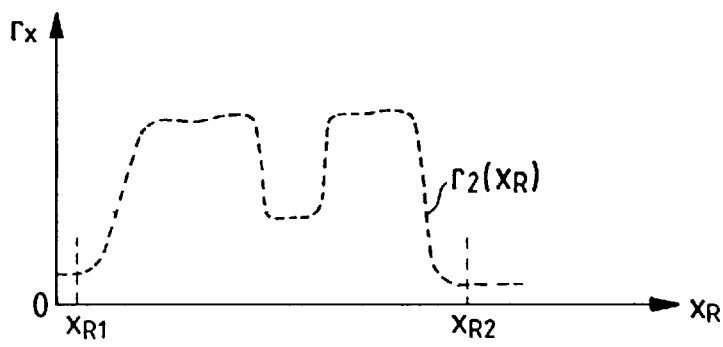
FIG. 7B is a graph showing a change in reticle reflectance in a case wherein the reticle is moved.

FIG. 7A shows examples of reference reflection data prepared as outputs $I_1(x_R)$ and $I_2(x_R)$ from the reflected light sensor 27, obtained at each scan position of a reticle on the basis of light reflected by the reference reflecting surfaces, and an output $Ix(x_R)$ from the reflected light sensor 27, obtained at each position of the reticle on the basis of light reflected by the wafer W during an exposure operation. Referring to FIG. 7A, the ordinate represents the intensity Ix of reflected light; and the abscissa represents the position $x_R$ of the reticle in the x direction. Assume that the reticle R is scanned from a position $X_{R1}$ to a position $x_{R2}$. For example, reflectance data $rx(x_R)$ corresponding to the scan position of the reticle is calculated according to equation (9) based on equation (8) on the basis of the output $Ix(x_R)$ from the reflected light sensor 27, obtained during an actual exposure operation with respect to the first shot area on the wafer W, the pre-stored data $I_1(x_R)$ and $I_2(x_R)$, and fixed constants $r_1$ and $r_2$. The reflectance data $rx(x_R)$ are stored in the memory at the same sampling intervals as the digital sampling intervals for the outputs $I_1(x_R)$ and $I_2(x_R)$ and at addresses uniquely corresponding to the respective scan positions. FIG. 7B shows the reflectance data $rx(x_R)$ corresponding to the position of the reticle. Referring to FIG. 7B represents the ordinate represents the wafer reflectance; and the abscissa, the scan position $x_R$ of the reticle in the x direction.

$$rx(x_R)=[(r_2-r_1)/(I_2(x_R)-I_1(x_R))]\times(Ix(x_R)-I_1(x_R))+r_1 \qquad (9)$$

Since the position $x_R$ changes with time, if the reticle stage RST is moving at a constant speed during an actual exposure operation, the reflectance data $rx(x_R)$ can be replaced with $rx(t)$. Therefore, by substituting equations (7) and (9) into equation (5), an energy value $E(t)$ is calculated by the main control system 100 at the predetermined time intervals $\Delta t$.

Figure 8A:
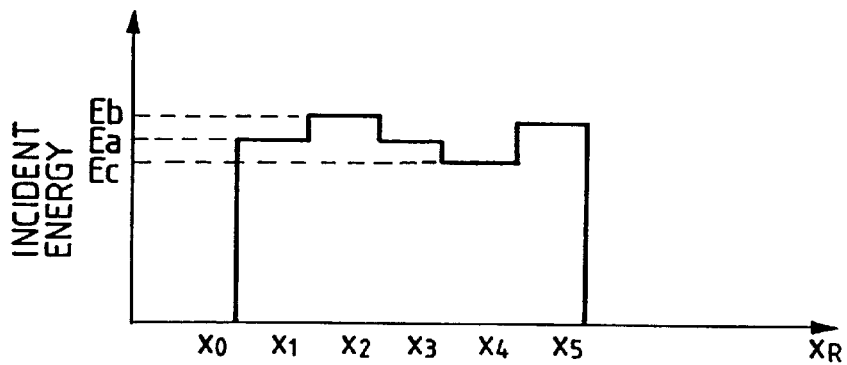
FIG. 8A is a graph showing the incident energy corresponding to each reticle position in a case wherein the reticle is scanned.
Figure 8B:
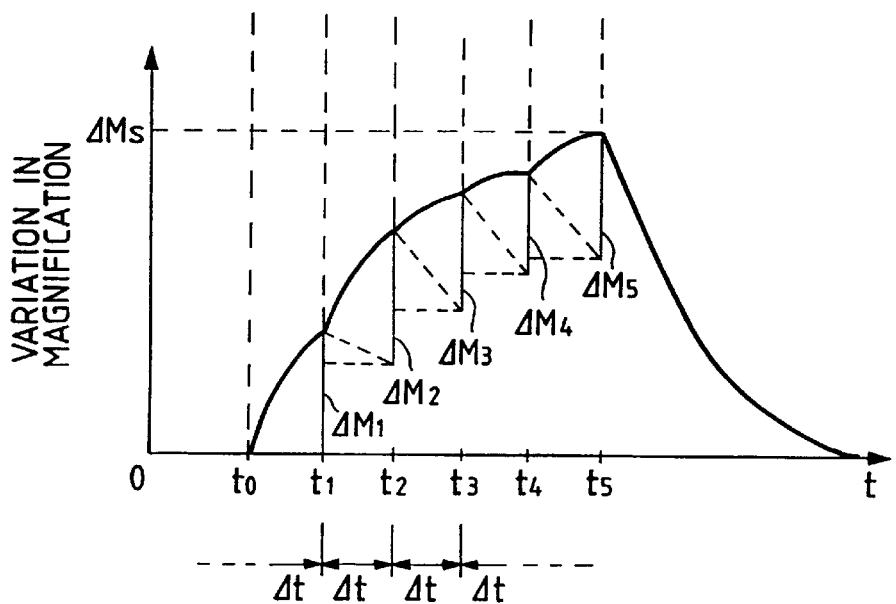
FIG. 8B is a graph showing variations in incident energy and imaging characteristic in a case wherein the incident energy changes at the respective positions (timings)

Calculation of the energy E incident on the projection optical system PL and calculation of a variation in imaging characteristic of the projection to FIGS. 8A and 8B. In this case, for the sake of a simple explanation, the variation $\Delta M$ in magnification of the projection optical system PL will be described hereinafter. FIG. 8A is a graph showing an amount E of light incident on the projection optical system PL, more specifically energies Ea, Eb, and Ec incident on the projection optical system PL. Referring to FIG. 8A, the instantaneous value or average value of incident energy, obtained at the position of the reticle stage RST at the predetermined time intervals $\Delta t$ (e.g., several msec to several tens of msec) is defined as the incident energy E. In FIG. 8A, predetermined timings (to be referred to as sampling timings hereinafter) at the predetermined time intervals $\Delta t$ are denoted by reference symbols $t_1$, $t_2$, $t_3$, $t_4$, and $t_5$, respectively, and the corresponding positions of the reticle stage RST are denoted by reference symbols $x_1$, $x_2$, $x_3$, $x_4$, and $x_5$, respectively. It is preferable that measurement of a sampling time be started when the reticle stage RST reaches the reference position set in storing each type of data described above, and the positions $x_1$ to $x_5$ coincide with the positions where the respective types of data are stored in the memory. As is apparent, the reticle stage RST is controlled to attain a predetermined speed before it reaches this reference position.

The main control system 100 calculates energy $E(t_1)=Ea$ which is incident on the projection optical system PL at the sampling timing $t_1$, as an estimated value, on the basis of a transmittance $\eta(x_1)$, a reflectance $rx(x_1)$, an illuminance $Ip(t_1)$, and the radiation area (determined by the reticle blind 8). IA' on the wafer W at the sampling timing $t_1$ and the position $x_1$ of the reticle stage RST, according to equations (5), (7), and (9). As described above, if a mercury discharge lamp or the like is used as a light source, opening/closing information about the shutter 2 (a weight of "1" is set if the shutter is open; and a weight of "0", if it is closed) and $Ip(t)$ for Ip=a constant value can be handled as a constant. Note that if the position $x_1$ where the transmittance $\eta(x_1)$ and the reflectance $rx(x_1)$ are stored does not correspond to the sampling timing $t_1$, a transmittance $\Delta(x_R)$ and a reflectance $rx(x_R)$ stored at a position x nearest to the position $x_1$ after the sampling timing $t_1$ may be used. The opening/closing information (1 or 0) about the shutter 2 may be used as follows. If the information indicates that the shutter 2 is open at a sampling timing, calculations are executed by using equations (5), (7), and (9) to obtain $E(t_1)=Ea$. If the information indicates that the shutter is closed, $E(t_1)=0$ is set without performing calculations according to equations (5), (7), and (9).

Incident energies are obtained at the sampling timings $t_2$ to $t_5$ in the same manner as described above. In this case, the incident energy Ea is obtained at the sampling timings $t_1$ and $t_3$; the incident energy Eb is obtained at the sampling timings $t_2$ and $t_5$; and the incident energy Ec is obtained at the sampling timing $t_4$.

Note that an incident energy may be obtained by using the average value of data obtained at the sampling time intervals $\Delta t$ (e.g., in the time interval between the sampling timings $t_1$ and $t_2$). Assume that the digital sampling interval for the transmittance data $\eta(x_R)$ and the reflectance data $rx(x_R)$ is set to be 25 $\mu$m on the reticle; the sampling time interval $\Delta t$ between the sampling timings $t_1$ and $t_2$ is set to be 5 msec; and a scan speed V is set to be 50 mm/sec. In this case, a distance L the reticle stage moves in the sampling time interval $\Delta t$ is expressed as $L=V\times \Delta t=250$ $\mu$m. Since the digital sampling interval for the transmittance data $\Delta(x_R)$ and the reflectance data $rx(x_R)$ is 25 $\mu$m, 10 transmittance data $\eta(x_R)$ and 10 reflectance data $rx(x_R)$ are obtained as sampled data in the sampling time interval $\Delta t$ between the sampling timings $t_1$ and $t_2$. Hence, the 10 transmittance data $\eta(x_R)$ and the 10 reflectance data $rx(x_R)$ as the sampled data may be averaged, respectively, and the resultant data may be used as average transmittance data $\eta(x_2)$ and average reflectance data $rx(x_2)$ at the sampling timing $t_2$. Subsequently, energy $E(t_2)=Eb$ which is incident on the projection optical system PL at the sampling timing $t_2$ is calculated as an estimated value on the basis of a transmittance $\eta(x_2)$, a reflectance $rx(x_2)$, an illuminance $Ip(t_2)$, opening/closing information about the shutter 2 (a weight of "1" is set if the shutter is open; and a weight of "0", if it is closed), and the area of a radiation area (determined by the reticle blind 8) on the wafer W at the sampling timing $t_2$, according to equations (5), (7), and (9). As described above, in this case, if the light source 1 is a light source for emitting pulse light, power in the sampling time interval $\Delta t$, as a unit time, between the sampling timings and $t_1$ and $t_2$ may be accumulated, and the resultant value may be used as average power $Ip(t_2)$ within the unit time. With regard to the digital sampling interval for the transmittance $\eta(x_R)$ and the reflectance $rx(x_R)$, since a resolving power smaller than the distance L the reticle stage moves in the sampling time interval $\Delta t$ is required, the sampling time interval $\Delta t$ is set such that the distance L becomes smaller than the width of the illumination area IA in the scan direction. Note that after the first shot, the incident energy E may be obtained by using the reflectance data $rx(x_R)$ stored in the memory when the first shot exposure is performed, without obtaining the reflectance $rx(x_R)$ according to equation (9).

Calculation of a variation in optical characteristic of the projection optical system PL on the basis of the amount of incident energy per unit time will be described further with reference to FIG. 8B. FIG. 8B shows a magnification variation characteristic $\Delta Ms$ with respect to the incident energy E. As shown in FIG. 8B, the magnification variation characteristic with respect to the incident energy E is dependent on $\Delta M/E$ and the time constant T, as in the case shown in FIG. 4B. Therefore, a variation in magnification with respect to incident energy at a position corresponding to each time (a predetermined time interval) can be obtained from the magnification variation characteristic determined by ΔM/E and the time constant T, like the one shown in FIG. 4B.

This operation will be described in detail below with reference to FIG. 8B. The variation $\Delta M_1$ in magnification, caused by the energy Ea between the sampling timings $t_0$ and $t_1$ is obtained from ΔM/E. As described above, ΔM/E is obtained in advance by an experiment or the like. Similarly, a variation $\Delta M_3$ in magnification, caused by the energy Eb between the sampling timings $t_1$ and $t_2$ is obtained from ΔM/E. The reduction rate of the magnification between the sampling timings $t_1$ and $t_2$ is determined by the thermal time constant T so that the reduction amount of the magnification which reduced with time in accordance with the time constant T can be obtained from the initial value ($\Delta M_1$ in this case) between the sampling timings $t_1$ and $t_2$. Therefore, the variation in magnification at the sampling timing $t_2$ is the value obtained by subtracting the reduction amount between the sampling timings $t_1$ and $t_2$ from the sum of $\Delta M_1$ and $\Delta M_2$. Similarly, a variation $\Delta M_3$ in magnification, caused by the energy Ea between the sampling timings $t_2$ and $t_3$, a variation $\Delta M_4$ in magnification, caused by the energy Ec between the sampling timings $t_3$ and $t_4$ and a variation $\Delta M_5$ in magnification, caused by the energy Eb between the sampling timings $t_4$ and $t_5$, can be obtained from ΔM/E. The reduction amount in each sampling interval is obtained in the same manner as described above, and the final variation in magnification at each sampling timing can be obtained. As a result, an envelope connecting the values at the respective sampling timings can be obtained as a magnification variation characteristic, as shown in FIG. 8B. Such calculation methods of sequentially obtaining a magnification variation characteristic from discrete magnification variation values are disclosed in U.S. Pat. Nos. 4,666,273 and 4,920,505.

A method of correcting a magnification will be described next.

The imaging characteristic controller 30 determines the control amount of the pressure control system 40 and the driving amounts of the driving elements 31, 34, and 35 so as to change the magnification in accordance with the magnification variation characteristic shown in FIG. 8B, thereby correcting the magnification. Note that the imaging characteristic controller 30 is exclusively used to adjust the magnification M in a direction perpendicular to the scan direction, and the magnification in the scan direction must be corrected by slightly changing the moving speed of the reticle R relative to the wafer W. Therefore, the relative speed must be finely adjusted in accordance with the adjusting amount of magnification corrected by the imaging characteristic controller 30 to isotopically change the size of a projection image on the entire surface of a shot area.

The above description is associated with the method of correcting a variation in magnification. Other imaging characteristics can be corrected in the same manner as described above. Note that the pattern of the reticle R is sequentially exposed on the wafer W a plurality of times. In order to improve the productivity, exposure may be performed by alternately scanning the wafer stage WST (reticle stage RST) in opposite directions in units of shot arrays on the wafer instead of scanning the stage in one direction all the time. That is, in some cases, after one shot array is exposed, another shot array is exposed while the stage is scanned in the opposite direction (i.e., exposure is performed while the stage is reciprocated). The transmittance data η, the reference reflectance data, and the like described above are stored or calculated in accordance with the position of the reticle R while the reticle R is moved in one direction (e.g., in the −x direction). For this reason, if the scan direction of the wafer stage WST is alternately reversed in units of shot arrays on a wafer (the scan direction of the reticle stage RST alternately changes to the −x direction and +x direction), the read direction of the transmittance data η, the reflectance data, and the like is switched in accordance with the scan direction. That is, when a scan operation is to be performed in a direction opposite to the scan direction, of the reticle stage RST, in which the transmittance data η and the reference reflectance data are stored, the transmittance data η, the reference reflectance data, and the like are read out from the memory in the opposite direction.

In this case, equations (5) and (6) may be used without any modification by obtaining an average transmittance and an average reflectance during a scan operation. In this method, however, an average transmittance and an average reflectance in one scan operation can only be treated as average values, and a reflectance can be calculated only after one scan operation, resulting in a deterioration in precision. Whether a deterioration in precision due to this method falls within an allowable range is determined in consideration of the precision required to calculate the variation ΔM in magnification, the variation ΔM in magnification in one scan operation, the comparison between the time required for one scan operation and the time constant T, a change in the transmittance η of the reticle R with a change in the position of the reticle R, and a change in the reflectance r of the wafer W with a change in the position of the reticle R. However, the time required for one scan operation is dependent on the sensitivity of a resist, and the uniformity of the transmittance and the like of a reticle to be used are indefinite factors. Therefore, in this embodiment, the intensity of light reflected by a wafer is obtained on the basis of reference reflectance data prepared on the basis of the intensity of light reflected by each reference reflecting surface in accordance with the scan position of a mask. With this operation, even if the intensity of reflected light changes in accordance with the position of the reticle, a correct reflectance can be obtained by scanning the reticle during an exposure operation.

The second embodiment of the present invention will be described next. The second embodiment is different from the first embodiment in the following point. In the second embodiment, light amount information (to be referred to as an offset component hereinafter) about light reflected by a reticle R or an optical member in an illumination optical system is stored in a memory in correspondence with the position of the reticle R, without obtaining reference reflectance data by using reference reflecting surfaces, and a value obtained by subtracting the offset component from an output Sb from a reflected light sensor 27 is used as the amount of light which is reflected by a wafer and incident on a projection optical system PL again. The same reference numerals in the second embodiment denote the same parts as in the first embodiment. In addition, in this embodiment, information required to obtain the amount of light (light energy) which is incident on the projection optical system PL through a reticle, i.e., information about the transmittance of the reticle (in this embodiment, the transmittance is the ratio of the amount of light in an illumination area IA to the amount of light which is not shielded by the light-shielding portion of a pattern but is transmitted therethrough) is detected on the basis of outputs from a radiation amount sensor 41 and a light source sensor 28.

A case wherein the amount of light which is incident on the projection optical system PL through a reticle is obtained will be described below.

A main control system 100 stores a ratio Sc/Sa of an output Sc from the radiation amount sensor 41 to an output Sa from the light source sensor 28 in an internal memory in synchronism with an operation of moving a reticle stage RST, on which the reticle R is mounted, by a distance corresponding to one scan operation. That is, the main control system 100 moves the reticle stage RST (while keeping a wafer stage WST at rest); converts the ratio Sc/Sa of the output Sc from the radiation amount sensor 41 to the output Sa from the light source sensor 28 into a time-series digital value in accordance with the position of the reticle stage RST which is detected by a interferometer 14; and stores the digital value in the internal memory. This ratio data becomes information corresponding to a variation in transmittance in a reticle scan operation. This ratio is denoted by reference symbol Rh. As described above, storage of data in the memory (digital sampling) may be performed for each predetermined moving amount (e.g., 0.01 $\mu$m to 10 $\mu$m) with reference to the resolving power (e.g., 0.01 $\mu$m) of the interferometer 14. The variable ratio Rh of the output Sc from the radiation amount sensor 41 to the output Sa from the light source sensor 28, obtained at each stored position of the reticle stage RST, is stored in the memory in correspondence with each position of the reticle stage RST. In an actual exposure operation, the ratio Rh stored in the memory in advance in correspondence with each position of the reticle stage RST at predetermined time intervals, e.g., about several msec,, is read out, and a value (Sa·Rh) obtained by multiplying the output Sa from the photoelectric sensor 28 in the actual exposure operation (the output value from the photoelectric sensor 28 at the predetermined time intervals) by the read value is used an estimated value of the amount of light (energy) which is incident on the projection optical system PL through the reticle at the predetermined time intervals. Since the main control system 100 is constituted by a general digital computer, the ratios Rh or the products Sa·Rh may be averaged, and the average value may be stored, similar to digital sampling of various types of data in the first embodiment. Alternatively, the ratios Rh or the products Sa·Rh sequentially calculated with a resolving power almost equal (or lower than) the resolving power, of the interferometer 14 may be stored without any modification.

Detection of information about the amount of light reflected by a wafer will be described below.

When energy incident on the projection optical system PL is to be considered, the amount of light which is reflected by a wafer and incident on the projection optical system PL again must be considered in addition to the amount of light which is incident on the projection optical system PL through a reticle. For this reason, the amount of light which is reflected by a wafer and incident on the projection optical system PL again is detected on the basis of the output Sb from the reflected light sensor 27. The main control system 100 moves the reticle stage RST by a distance corresponding to one scan operation while the reticle R is mounted on the stage, and stores (digitally samples) the time-series photoelectric signal Sb (light amount information) from the reflected light sensor 27 in the memory in accordance with the position of the reticle stage RST which is detected by the interferometer 14. For example, storage of data in the memory may be performed for each predetermined moving amount with reference to the resolving power (e.g., 0.01 $\mu$m) of the interferometer 14. In this case, the digital sampling interval need not coincide with the resolving power of the interferometer 14 and may be set to be larger than that, e.g., 0.2 $\mu$m to 10 $\mu$m.

The output Sb from the reflected light sensor 27 includes information about the amount of light reflected by the reticle R and optical members in the illumination optical system. For this reason, the reticle R is scanned after the reference reflecting surface of a reference plate FM having a reflecting surface having an almost zero reflectance is located within a projection area IA' of the projection optical system PL. In this scan operation, reflected light is received by the reflected light sensor 27, and a variation in the output Sb is stored in the memory in accordance with the position of the reticle stage RST. The stored data is used as information about the amount of light reflected by the reticle R and optical members in the illumination optical system. This information will be referred to as an offset component hereinafter. In an actual exposure operation, the stored offset component may be subtracted from the output value Sb from the reflected light sensor 27.

In the above case, if the photoelectric sensor 28, the radiation amount sensor 41 and the reflected light sensor 27 are to receive pulse light, the intensity of each pulse may be detected, or power in a short period of time, e.g., a unit time of several to several tens of msec, may be accumulated, and the resultant value may be output as average power in the unit time.

Calculation of an amount E of light incident on the projection optical system PL will be described next with reference to FIGS. 8A and 8B.

The amount E of light incident on the projection optical system PL and a variation in imaging characteristic of the projection optical system PL can be obtained in the same manner as in the first embodiment. This operation will be briefly described below. In this embodiment, reference symbols Ea, Eb, and Ec in FIG. 8A denote the sums of the amounts of light incident on the projection optical system PL from the reticle side and the amounts of light incident on the projection optical system PL again from the wafer side, with the position of the reticle stage RST being used as a variable. The main control system 100 detects the output Sa from the photoelectric sensor 28 and the output Sb from the reflected light sensor 27 at a sampling timing $t_1$. The main control system 100 reads out the output Sa obtained the photoelectric sensor 28 at a position $x_1$ corresponding to the sampling timing $t_1$, the ratio Rh obtained by the radiation amount sensor 41, and an offset component from the memory. The main control system 100 adds the product of the output Sa from the photoelectric sensor 28 and the ratio Rh to a value obtained by subtracting the offset component corresponding to the position $x_1$ (or the timing $t_1$) from the output Sb from the reflected light sensor 27. The main control system 100 then calculates an estimated value of energy Ea incident on the projection optical system PL at the sampling timing $t_1$ on the basis of opening/closing information about a shutter 2 (a weight of "1" is set if the shutter is open; and a weight of "0", if it is closed), and the area of a radiation area (determined by a reticle blind 8) IA' on the wafer W.

Note that if the position $x_1$ where the ratio Rh and the offset component are stored does not correspond to the sampling timing $t_1$, the ratio Rh and an offset component stored at a nearest position x after the sampling timing $t_1$ may be used.

Incident energies are obtained at sampling timings $t_2$ to $t_5$ in the same manner as described above. In this case, the incident energy Ea is obtained at the sampling timings $t_1$ and $t_3$; the incident energy Eb is obtained at the sampling timings $t_2$ and $t_5$; and the incident energy Ec is calculated at the sampling timing $t_4$.

Note that an incident energy may be obtained by using the average value of data obtained at sampling time intervals $\Delta t$ (e.g., in the time interval between the sampling timings $t_1$ and $t_2$), similar to the first embodiment. Assume that the digital sampling interval for the ratios Rh and offset components is set to be 25 μm on a reticle; the sampling time interval Δt between the sampling timings $t_1$ and $t_2$ is set to be 5 msec; and a scan speed V is set to be 50 mm/sec. In this case, 10 ratios Rh and 10 offset components are obtained as sampled data in the sampling time interval Δt between the sampling timings $t_1$ and $t_2$. Hence, similar to the first embodiment, the incident energy Eb may be obtained on the basis of data obtained by averaging the 10 ratios Rh and the 10 offset components, respectively.

When the incident energy is obtained, a variation in magnification at each sampling timing is obtained from ΔM/E, and the reduction rate of magnification in each sampling time interval is obtained from the time constant T in the same manner as in the first embodiment. As a result, an envelope connecting the values at the respective sampling timings is set as a magnification variation characteristic, thus obtaining the magnification variation characteristic shown in shown in FIG. 8B. An imaging characteristic controller 30 determines the control amount of a pressure control system 40 and the driving amounts of driving elements 31, 34, and 35 so as to change the magnification in accordance with the magnification variation characteristic shown in FIG. 8B, thereby correcting the magnification.

In this embodiment, the ratios Rh and offset components are loaded by moving the reticle stage RST in one direction. For this reason, when the reticle stage RST is to be scanned in a direction different from the loading direction of the ratios Rh and the offset components, these data must be read out in the opposite direction.

In the first and second embodiments, information about the transmittance of a reticle and information about light reflected by a wafer are stored in accordance with the coordinate position of the reticle. However, since the wafer stage WST is scanned at the same time, the same effect as that described above can be obtained even if these pieces of information are stored with reference to the coordinate position of the wafer stage or time. When storage of data is to be performed with reference to the coordinate position, an interferometer counter must be reset to "0" at the start of a scan operation, or the coordinate position at the start of a scan operation must be stored. When storage of data is to be performed with reference to time, the time base scale needs to be changed because the scan speed changes with a change in exposure time owing to the sensitivity of a resist. Note that although the precision slightly deteriorates, in the above embodiments, the variation characteristic of imaging characteristic of the projection optical system PL may be obtained on the basis of only the amount of light which is incident on the projection optical system PL through a reticle.

When the illumination condition is changed upon replacement of an aperture stop 29, the passing position of a light beam in the projection optical system PL changes, and hence the variation characteristic of imaging characteristic changes. For example, a thermal time constant and the like associated with a variation in magnification change. Therefore, information (e.g., a thermal time constant) about the variation characteristic of imaging characteristic must be replaced every time the illumination condition is changed upon replacement of the aperture stop 29.

Figure 9:
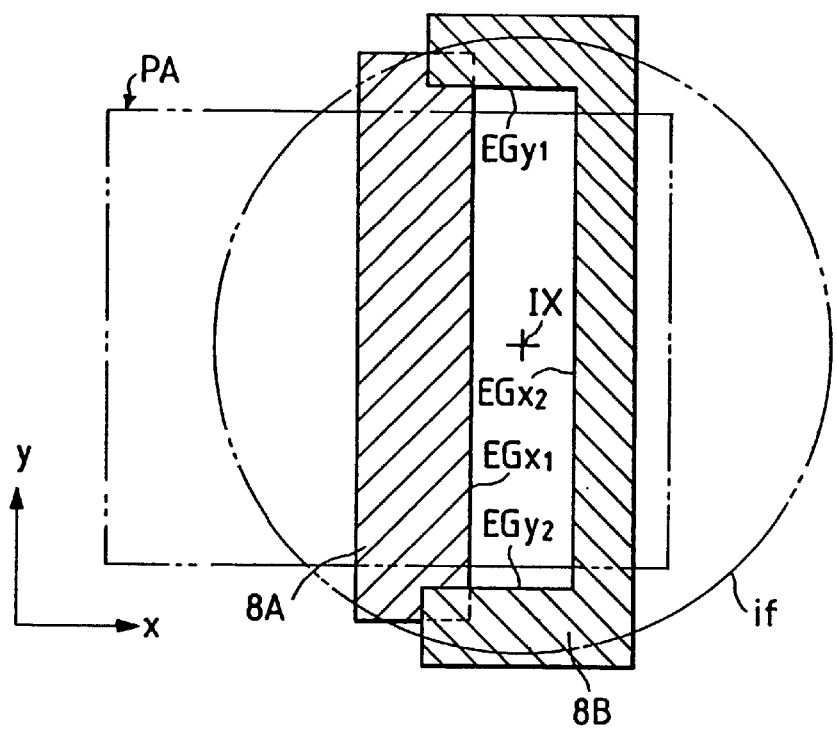
FIG. 9 is a plan view showing the relationship between a reticle blind viewed from above and a projection field.
Figure 10:
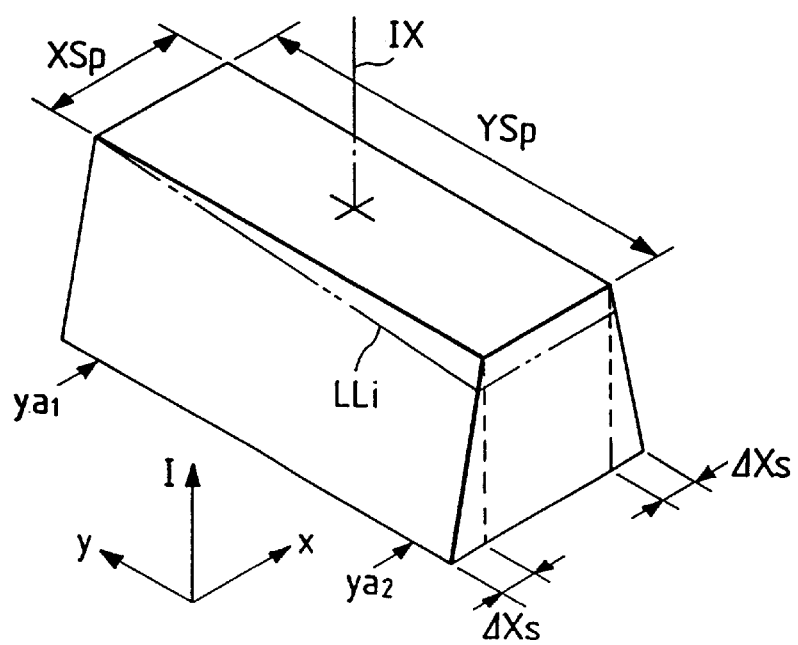
FIG. 10 is a perspective view stereoscopically showing the illuminance distribution of illumination light.

FIG. 9 shows the positional relationship between the reticle blind 8 viewed from above, a projection field if, and a pattern area PA of the reticle R. In this case, the reticle blind 8 is constituted by two light-shielding plates 8A and 8B. The light-shielding plate 8B has a U shape when viewed from above. The light-shielding plate 8B has a straight edge $EGx_2$ defining an illumination area in the scan direction (x direction), and straight edges $EGy_1$ and $EGy_2$ defining the illumination area in the y direction perpendicular to the scan direction. The light-shielding plate 8A has a straight edge $EGx_1$ parallel to the edge $EGx_2$ of the light-shielding plate 8B to define the illumination area in the scan direction. The light-shielding plate 8A is designed to be movable in the x direction with respect to the light-shielding plate 8B. With this structure, the width of the slit-like illumination area IA can be changed in the scan direction. The light-shielding plate 8B may also be designed to be translated in the x direction such that the edges $EGx_1$ and $EGx_2$ defining the illumination area in the scan direction are set to be symmetrical with respect to an optical axis IX. FIG. 10 is a perspective view stereoscopically showing the intensity distribution of illumination light which is incident on the reticle R through the reticle blind 8 shown in FIG. 9. Referring to FIG. 10, a direction along the optical axis IX is defined as an intensity axis I. No significant problem is posed when a continuous light source such as a mercury discharge lamp is used as an illumination light source. However, when a pulse light source is to be used, if the illuminance distribution in the scan direction exhibits a normal rectangular shape, exposure light amount irregularity tends to occur in one shot area on the wafer W because of variations in superposition amount or in the number of times of superposition at two end portions of the illuminance distribution in the scan direction.

For this reason, as shown in FIG. 10, at least end portions of the illuminance distribution in the scan direction are caused to have almost uniform inclinations (width ΔXs). Referring to FIG. 10, a length YSp of the illuminance distribution in the y direction is set to cover the length of the pattern area PA of the reticle R in the y direction, and a length (slight width) XSp of the illuminance distribution in the x direction is optimally determined in consideration of a target exposure light amount for the photoresist on the wafer W, the scan speeds of the reticle stage RST and the wafer stage WST, the pulse oscillation frequency of a pulse light source (if it is used), the intensity of illumination light, and the like. As shown in FIG. 10, in order to incline the two ends of the illuminance distribution by the width ΔXs, the edge $EGx_1$ of the light-shielding plate 8A and the edge $EGx_2$ of the light-shielding plate 8B in FIG. 9 may be shifted from a position conjugate to the pattern surface of the reticle R in a direction along the optical axis IX by a predetermined amount so as to project slightly defocused images of the edges $EGx_1$ and the $EGx_2$ onto the reticle R. When, however, sharp images of the edges $EGy_1$ and $EGy_2$ in a non-scan direction are to be formed on the pattern surface of the reticle R, the edges $EGy_1$ and $EGy_2$ must be accurately located at a position conjugate to the pattern surface of the reticle R. For this reason, the edges $EGy_1$ and $EGy_2$ are accurately located within a conjugate plane, and the edges $EGx_1$ and $EGx_2$ are located within a plane slightly shifted from the plane position of the edges $EGy_1$ and $EGy_2$ to the light source side. In addition, in order to variably change the longitudinal dimension (length YSp) of the slit-like illumination area IA, the edges $EGy_1$ and $EGy_2$ must also be designed to be movable in the y direction. If the illuminance distribution shown in FIG. 10 is uniformly inclined in the y direction, as indicated by an imaginary line LLi, the exposure light amount at a portion of a shot area which is exposed at a position $ya_1$ in the y direction differs from that at a portion of the shot area which is exposed at a position $ya_2$. For this reason, it is preferable that an intensity $I(ya_1)$ at the position ya$_1$ and an intensity I(ya$_2$) at the position ya$_2$ be measured to finely adjust the slit width XSp in the y direction in accordance with a ratio I(ya$_1$)/I(ya$_2$). Let XSp (ya$_1$) be the width of the slit-like illumination area IA in the scan direction at the position ya$_1$ in the y direction, and XSp(ya$_2$) be the width in the scan direction at the position ya$_2$. In this case, the edges EGx$_1$ and EGx$_2$ are inclined (rotated) relative to each other from the parallel state within the x-y plane so that I(ya$_1$)/I(ya$_2$)=XSp(ya$_2$)/XSp(ya$_1$)) is established. That is, the slit-like blind opening shown in FIG. 9 is formed into a slightly trapezoidal shape. With this arrangement, an accurate amount of exposure light can be given to each point in a shot area even with slight illuminance irregularity (uniform inclination) of slit-like illumination light in a non-scan direction.

Figure 11:
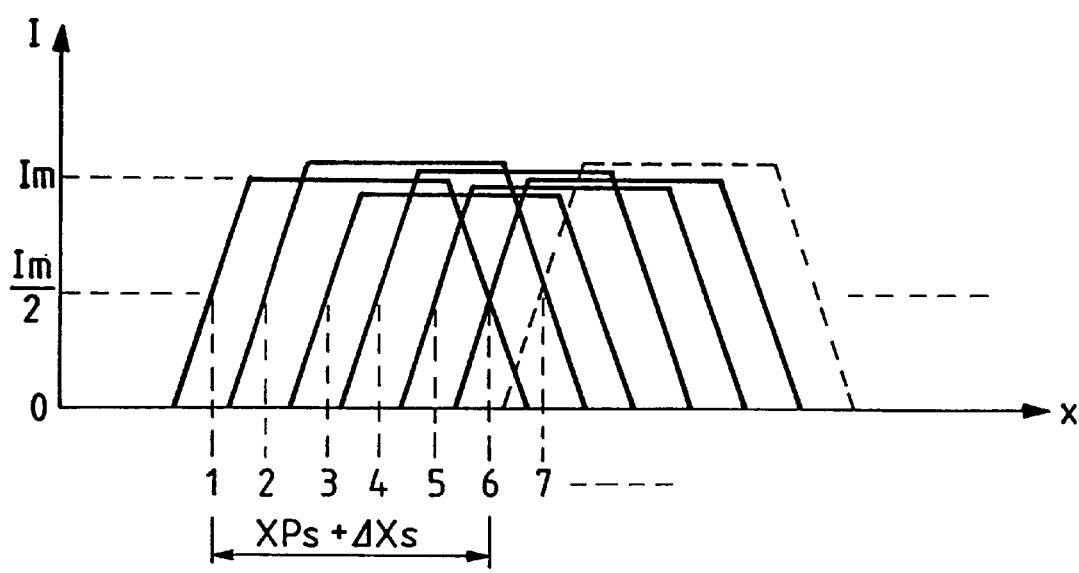
FIG. 11 is a graph showing the illuminance distribution in the scan direction.

When a pulse light source is to be used, pulse emission must be performed with a specific positional relationship while the reticle R and the wafer W are relatively scanned. FIG. 11 illustrates illuminance characteristics in the scan direction when pulse emission is performed with the specific positional relationship. In pulse emission, since the peak intensity value of each pulse varies, pulse emission (trigger operation) is performed at intervals of a distance into which the width (XPs+AXs) of the slit-like illumination area IA in the scan direction can be divided by a predetermined integer value Np (excluding 1) when the illumination area IA is defined by an intensity Im/2 where Im is the average value of the intensities of pulse light. Assume that the width (XPs+AXs) of the slit-like illumination area IA on the reticle is 8 mm, and the integer value Np is 20. In this case, the pulse light source may be caused to emit pulse light every time the reticle R is scanned/moved by 0.4 mm. The integer value Np is the number of pulses superposed at an arbitrary point on the wafer W. Therefore, in order to achieve a desired exposure precision on a wafer by averaging variations in peak intensity value of each pulse, the minimum value of the integer value Np is automatically determined in accordance with the variations in intensity of each pulse. The minimum value of the integer value Np is expected to be about 20 from the performance of an existing pulse light source (e.g., an excimer laser).

Referring to FIG. 11, since the integer value NP is set to be 5, the inclination of the trailing end portion of the illuminance distribution of the first pulse in the scan direction overlaps the inclination of the leading end portion of the illumination distribution of the sixth pulse in the scan direction. In addition, at the start or end of a scan/exposure operation, pulse oscillation is started from a state wherein the entire slit-like illumination area IA (width: XPs+2ΔXs) is located outside the pattern area PA of the reticle R, and the pulse oscillation is stopped when the entire illumination area IA (width: XPs+2ΔXs) reaches the outside of the pattern area PA.

Two methods of triggering a pulse light source can be considered. One method is a position synchronization trigger method of supplying a trigger signal to the pulse light source for a predetermined moving amount in response to a measurement value obtained by the laser interferometer 14 (or 19) for measuring the position of the reticle stage RST (or the wafer stage WST) in the scan direction. The other method is a time synchronization trigger method of generating clock signals at predetermined time intervals (e.g., 2 msec) based on the constant speeds of the reticle stage RST and the wafer stage WST, assuming that constant speed control therefor is reliable, and supplying the signals, as trigger signals, to the pulse light source. The two methods have their own merits and demerits and hence may be selectively used. In the time synchronization trigger method, however, the generation start timing and stop timing of clock signals must be determined in response to measurement values obtained by the laser interferometer 14 or 19.

If the highest priority is given to the minimization of the exposure processing time for one shot area, the speeds of the reticle stage RST and the wafer stage WST, the width (XPs) of the slit-like illumination area IA, and the peak intensity of pulses are preferably set so that the pulse light source oscillates at about the rated maximum oscillation frequency (a predetermined maximum frequency), provided that a target exposure amount can be obtained.

Furthermore, as described in each embodiment, when various data are to be formed by sampling the outputs Sa and Sb from the photoelectric sensor 28 and the reflected light sensor 27 while scanning only the reticle R, or when the pulse light source is oscillated by the time synchronization trigger method, the outputs Sa and Sb during a scan/exposure operation may be sampled in response to trigger clock signals.

What is claimed is:

1. A method of scanning exposure, comprising:
   synchronously moving a mask and a substrate so as to expose said substrate to an image of a pattern of said mask; and
   adjusting, during the synchronous movement of said mask and said substrate, an imaging characteristic of the image of the pattern of said mask projected onto said substrate;
   wherein said adjusting is performed in accordance with a position of said mask or a position of said substrate during said synchronous movement.

2. A method according to claim 1, wherein said adjusting includes adjusting an optical characteristic of a projection optical system for projecting the image of the pattern of said mask onto said substrate.

3. A method according to claim 2, wherein said adjusting of the imaging characteristic includes adjusting a movement speed of at least one of said mask and said substrate, the adjusted movement speed corresponding to the optical characteristic of the projection optical system.

4. A method according to claim 2, wherein said adjusting of the optical characteristic is performed by moving a part of lens elements in said projection optical system.

5. A method according to claim 4, wherein said optical characteristic comprises at least one of a focus position, a magnification of projection, distortion, and curvature of field.

6. A method according to claim 5, wherein said optical characteristic includes distortion of a trapezoid shape or distortion of a rhombus shape.

7. A method according to claim 2, wherein said adjusting of the optical characteristic is performed by adjusting pressure of a sealed space in said projection optical system.

8. A method according to claim 1, wherein said adjusting includes moving said mask relative to a projection optical system for projecting the image of the pattern of said mask onto said substrate.

9. A method according to claim 8, wherein distortion of the image of the pattern on said mask is adjusted by the movement of said mask relative to said projection optical system.

10. A method according to claim 1, wherein said imaging characteristic comprises at least one of a focus position, a magnification of projection, distortion, curvature of field, and astigmatism.

11. An apparatus according to claim 1, wherein said adjusting is performed with reference to time.

12. A method according to claim 1, further comprising:
emitting a pulsed exposure beam at substantially a rated maximum frequency, the exposure beam being directed to said mask to project the image of the pattern of said mask onto said substrate.

13. A method according to claim 12, further comprising:
adjusting an intensity of said exposure beam such that said substrate is supplied with a target exposure dose by irradiation with pulses of said exposure beam emitted at substantially said rated frequency.

14. A method according to claim 12, further comprising:
adjusting a width of an illumination area of said exposure beam in a scanning direction of said substrate such that said substrate is supplied with a target exposure dose by irradiation with pulses of said exposure beam emitted at substantially said rated maximum frequency.

15. A method according to claim 1, further comprising:
adjusting a shape of an illumination area of an exposure beam to which said substrate is exposed, based on an intensity distribution of said exposure beam in a direction perpendicular to a scanning direction of the substrate.

16. A method according to claim 15, wherein said exposure beam has an intensity distribution in said scanning direction, and said intensity distribution in said scanning direction has a slope portion in an end portion thereof.

17. A process of manufacturing a device, said process including a method of scanning exposure which comprises:
synchronously moving a mask and a substrate so as to expose said substrate to an image of a pattern of said mask; and
adjusting, during the synchronous movement of said mask and said substrate, an imaging characteristic of the image of the pattern of said mask projected onto said substrate;
wherein said adjusting is performed in accordance with a position of said mask or a position of said substrate during said synchronous movement.

18. A scanning exposure method for transferring a pattern of a mask onto a substrate while moving said mask and said substrate synchronously, comprising:
adjusting a shape of an illumination area of an illumination pulsed light with which said substrate is irradiated, based on an intensity distribution of said illumination pulsed light in a direction perpendicular to a moving direction of the substrate;
wherein said illumination pulsed light has an intensity distribution in the moving direction of the substrate and wherein said intensity distribution in the moving direction changes gradually in an end portion of said illumination pulsed light; and
exposing an substrate to said image of the pattern of said mask after said adjusting.

19. A method according to claim 18, wherein said adjusting includes moving a defining member which defines said illumination area with respect to the moving direction of the substrate.

20. A method according to claim 19, wherein said adjusting includes adjusting the shape of the illumination area into a trapezoid shape in accordance with the intensity distribution of said illumination pulsed light in said perpendicular direction.

21. A method according to claim 18, wherein the change in the intensity distribution in said end portion is generated by an optical member disposed in an optical path of said illumination pulsed light.

22. A method according to claim 21, wherein said optical member is a blind member disposed at a position which is not conjugate with a pattern surface of said mask.

23. A method according to claim 18, wherein each point on said substrate is irradiated with an integer number of light pulses during the exposure of said substrate.

24. A method according to claim 18, further comprising:
adjusting, during the synchronous movement of said mask and said substrate, an imaging characteristic of said image of the pattern of said mask.

25. A method according to claim 24, wherein said adjusting includes moving said mask relative to a projection system which projects said image of the pattern of said mask onto said substrate.

26. A method according to claim 18, wherein said illumination pulsed light is emitted from a light source substantially at a rated maximum frequency.

27. A method according to claim 26, further comprising:
adjusting an intensity of said illumination pulsed light such that said substrate is supplied with a target exposure dose by irradiation with said illumination pulsed light emitted from said light source at substantially said rated maximum frequency.

28. A method according to claim 26, further comprising:
adjusting a width of an illumination area of said illumination pulsed light in the moving direction of said substrate such that said substrate is supplied with a target exposure dose by irradiation with said illumination pulsed light emitted from said light source at substantially said rated maximum frequency.

29. A method according to claim 18, wherein said illumination area has rectangular shape.

30. A process of manufacturing a device, said process including a scanning exposure method for transferring a pattern of a mask onto a substrate while moving said mask and said substrate synchronously, said scanning exposure method comprising:
adjusting a shape of an illumination area of an illumination pulsed light with which said substrate is irradiated, based on an intensity distribution of said illumination pulsed light in a direction perpendicular to a moving direction of the substrate;
wherein said illumination pulsed light has an intensity distribution in the moving direction of the substrate and wherein said intensity distribution in the moving direction changes gradually in an end portion of said illumination pulsed light; and
exposing said substrate to said image of the pattern of said mask after said adjusting.

31. A scanning exposure method for transferring an image of a pattern of a mask onto a substrate while synchronously moving said mask and said substrate relative to a pulsed light, comprising:
regulating a pulsed light source such that the pulsed light with which said mask is irradiated during the synchronous movement of said mask and said substrate oscillates substantially at a rated maximum frequency; and
adjusting an intensity of said pulsed light such that said substrate is supplied with a target exposure dose by irradiation with the pulsed light oscillated at substantially said rated maximum frequency.

32. A scanning exposure method according to claim 31, wherein the number of light pulses with which each point on said substrate is irradiated during the scanning exposure is an integer.

33. A method according to claim 31, further comprising:
adjusting, during the synchronous movement of said mask and said substrate, an imaging characteristic of said image of the pattern of said mask.

34. A method according to claim 33, wherein said adjusting includes moving said mask relative to a projection system which projects said image of the pattern of said mask onto said substrate.

35. A method according to claim 31, wherein said pulsed light has a rectangular illumination area.

36. A method according to claim 31, further comprising:
adjusting a width of an illumination area of said pulsed light in a synchronous movement direction of said substrate such that said substrate is supplied with a target exposure dose by irradiation with said pulsed light oscillated at substantially said rated maximum frequency.

37. A scanning exposure method in which a pattern of a mask is transferred onto a substrate while moving said mask and said substrate synchronously, said method comprising:
exposing one shot area on said substrate while moving said mask in a first direction; and
exposing another shot area on said substrate while moving said mask in a second direction reverse to said first direction; and
wherein a first exposure operation for said exposure performed while moving said mask in said first direction is different from a second exposure operation for said exposure performed while moving said mask in said second direction.

38. A method according to claim 37, wherein an adjusting operation of an imaging characteristic of a pattern image projected onto said substrate is performed during each of said exposures.

39. A method according to claim 38, wherein a first way of using data to perform the adjusting operation for said exposure performed while moving said mask in said first direction is different from a second way of using said data to perform the adjusting operation for said exposure performed while moving said mask in said second direction.

40. A method according to claim 39, wherein said first way is different from said second way in a way of reading out said data.

41. A method according to claim 39, wherein said data includes data corresponding to a position of said mask or said substrate during said exposures.

42. A method according to claim 39, wherein said data includes data related to beam energy incident on a projection system which projects said pattern image onto said substrate.

43. A method according to claim 39, wherein said data comprises information regarding at least one of transmittance and reflectance of said mask.

44. A method according to claim 38, wherein said adjusting operation includes adjusting, during said exposures, an optical characteristic of a projection optical system which projects said pattern image onto said substrate.

45. A process of manufacturing a device, said process including a scanning exposure method in which a pattern of a mask is transferred onto a substrate while moving said mask and said substrate synchronously, said scanning exposure method comprising:
exposing one shot area on said substrate while moving said mask in a first direction; and
exposing another shot area on said substrate while moving said mask in a second direction reverse to said first direction; and
wherein a first exposure operation for said exposure performed while moving said mask in said first direction is different from a second exposure operation for said exposure performed while moving said mask in said second direction.

46. A scanning exposure apparatus comprising:
a projection optical system, disposed between a mask and a substrate, which projects an image of a pattern on said mask onto said substrate;
a scanning system which moves said mask and said substrate synchronously to expose said substrate to the image of the pattern on said mask;
an adjusting system associated with said scanning system, which adjusts an image characteristic of the image of the pattern projected through said projection optical system during the synchronous movement of said mask and said substrate;
a first interferometer operatively connected to the scanning system, which measures a position of said mask; and
a second interferometer operatively connected to the scanning system, which measures a position of said substrate;
wherein said adjusting system performs the adjustment of said imaging characteristic in accordance with a position of said mask measured by said first interferometer or a position of said substrate measured by said second interferometer.

47. An apparatus according to claim 46, wherein said adjusting system includes a device which moves a part of lens elements in said projection optical system.

48. An apparatus according to claim 46, wherein said adjusting system includes a device which moves said mask.

49. An apparatus according to claim 46, wherein said adjusting system includes a device which adjusts pressure of a sealed space in said projection optical system.

50. An apparatus according to claim 46, further comprising:
a beam source which emits pulses of an exposure beam substantially at a rated maximum frequency, said exposure beam being directed to said mask to project the image of the pattern on said mask onto said substrate.

51. An apparatus according to claim 50, wherein an intensity of said exposure beam is adjusted such that said substrate is supplied with a target exposure dose by irradiation with said pulses of said exposure beam emitted from said beam source at substantially said rated maximum frequency.

52. An apparatus according to claim 50, wherein a width of said exposure beam in a synchronous movement direction of said substrate is adjusted such that said substrate is supplied with a target exposure dose by irradiation with said pulses of said exposure beam emitted from said beam source at substantially said rated maximum frequency.

53. An apparatus according to claim 46, further comprising:
a beam source which emits an exposure beam, said exposure beam being directed to said mask to project the image of the pattern of said mask onto said substrate; and
an adjusting device, disposed between said beam source and said substrate, which adjusts a shape of an irradiation area of said exposure beam based on an intensity distribution of said exposure beam in a direction perpendicular to a scanning direction of said substrate.

54. An apparatus according to claim 53, wherein said exposure beam is a pulsed beam, said pulsed beam has an intensity distribution in the scanning direction, and said intensity distribution in the scanning direction has a slope portion in an end thereof.

55. A device manufacturing method including an exposure process in which a device pattern formed on a mask is transferred onto a substrate while synchronously moving said mask and said substrate, the method comprising:
regulating a beam source such that pulses of an exposure beam to which said substrate is exposed through said mask are emitted substantially at a rated maximum frequency; and
adjusting an intensity of said pulses such that said substrate is supplied with a target exposure dose by irradiation with said pulses emitted from said beam source at substantially said rated maximum frequency.

56. A scanning exposure apparatus comprising:
a light source which emits pulsed light;
a scanning system which moves a mask and a substrate synchronously to expose said substrate to an image of a pattern on said mask;
an adjusting device, disposed between said light source and said substrate, which adjusts a shape of illumination area of the pulsed light based on an intensity distribution of said pulsed light in a direction perpendicular to a moving direction of said substrate; and
wherein said pulsed light has an intensity distribution in the moving direction and said intensity distribution in the moving direction changes gradually in an end portion of said pulsed light.

57. An apparatus according to claim 56, wherein said adjusting device comprises a blind member disposed at a position which is not conjugate with a pattern surface of said mask.

58. An apparatus according to claim 56, wherein each point on said substrate is irradiated with an integer number of light pulse s during the exposure of said substrate.

59. An apparatus according to claim 56, further comprising:
an image control system which changes, during the synchronous movement of said mask and said substrate, an imaging characteristic of said image of the pattern on said mask.

60. An apparatus according to claim 59, wherein said image control system moves said mask relative to a projection system which projects said image of the pattern on said mask onto said substrate.

61. An apparatus according to claim 56, wherein said light source emits the pulsed light substantially at a rated maximum frequency.

62. An apparatus according to claim 61, wherein an intensity of said pulsed light is adjusted such that said substrate is supplied with a target exposure dose by irradiation with the pulsed light emitted from said light source at substantially said rated maximum frequency.

63. An apparatus according to claim 61, wherein a width of an illumination area of said pulsed light in the moving direction of said substrate is adjusted, such that said substrate is supplied with a target exposure dose by irradiation with the pulsed light emitted from said light source at substantially said rated maximum frequency.

64. A scanning exposure apparatus comprising:
a light source which emits pulsed light for a scanning exposure in which a mask and a substrate are synchronously moved relative to said pulsed light; and
an adjusting device, operatively connected with said light source, which adjusts said light source such that the pulsed light oscillates substantially at a rated maximum frequency, and which adjusts an intensity of said pulsed light such that said substrate is supplied with a target exposure dose by irradiation with the pulsed light oscillated at substantially said rated maximum frequency.

65. An apparatus according to claim 64, further comprising:
an image control system which changes, during the synchronous movement of said mask and said substrate, an imaging characteristic of an image of a pattern of said mask.

66. An apparatus according to claim 65, wherein said image control system moves said mask relative to a projection system which projects said image of the pattern of said mask onto said substrate.

67. An apparatus according to claim 64, further comprising:
an optical device disposed between said light source and said substrate, which adjusts a width of an illumination area of said pulsed light in a synchronous movement direction of said substrate such that said substrate is supplied with a target exposure dose by irradiation with the pulsed light oscillated at substantially said rated maximum frequency.

68. A scanning exposure apparatus comprising:
a scanning system which moves a mask and a substrate synchronously to transfer a pattern of said mask onto said substrate, where in said mask is moved in a first direction to expose one shot area on said substrate and said mask is moved in a second direction which is reverse to said first direction to expose another shot area on said substrate; and
an exposure system, associated with said scanning system, which controls a n exposure process, wherein said exposure process includes a first exposure operation for the exposure performed while moving said mask in said first direction and a second exposure operation, which is different from said first exposure operation, for the exposure performed while moving said mask in said second direction.

69. A method according to claim 68, wherein said exposure process includes an adjusting operation of an imaging characteristic of a pattern image.

70. A method according to claim 69, wherein said adjusting operation includes adjusting, during said exposures, an optical characteristic of a projection optical system which projects said pattern image onto said substrate.

71. A method for making a scanning exposure apparatus, said method comprising:
providing a projection optical system, disposed between a mask and a substrate, which projects an image of a pattern on said mask onto said substrate;
providing a scanning system which moves said mask and said substrate synchronously to expose said substrate to the image of the pattern on said mask;
providing an adjusting system, associated with said scanning system, which adjusts an image characteristic of the image of the pattern projected through said projection optical system during the synchronous movement of said mask and said substrate;
providing a first interferometer which measures a position of said mask; and
providing a second interferometer which measures a position of said substrate;
wherein said adjusting system performs the adjustment of said imaging characteristic in accordance with a position of said mask measured by said first interferometer or a position of said substrate measured by said second interferometer.

72. A method according to claim 71, wherein said adjusting system includes a device which moves a part of lens elements in said projection optical system.

73. A method according to claim 71, wherein said adjusting system includes a device which moves said mask.

74. A method according to claim 71, wherein said adjusting system includes a device which adjusts pressure of a sealed space in said projection optical system.

75. A method according to claim 71, wherein said adjusting system adjusts said imaging characteristic based on beam energy incident on said projection optical system.

76. A method for making a scanning exposure apparatus, said method comprising:
   providing a light source which emits pulsed light;
   providing a scanning system which moves a mask and a substrate synchronously to expose said substrate to an image of a pattern on said mask;
   providing an adjusting device, disposed between said light source and said substrate, which adjusts a shape of illumination area of said pulsed light based on an intensity distribution of said pulsed light in a direction perpendicular to a moving direction of said substrate; and
   wherein said pulsed light has an intensity distribution in the moving direction and said intensity distribution in the moving direction changes gradually in an end portion of said pulsed light.

77. A method according to claim 76, wherein said adjusting device comprises a blind member disposed at a position which is not conjugate with a pattern surface of said mask.

78. An apparatus according to claim 76, wherein each point on said substrate is irradiated with an integer number of light pulses during the exposure of said substrate.

79. A method for making a scanning exposure apparatus, said method comprising:
   providing a light source which emits pulsed light for scanning exposure; and
   providing an adjusting device, operatively connected to said light source, which adjusts said light source such that the pulsed light oscillates substantially at a rated maximum frequency, and which adjusts an intensity of said pulsed light such that said substrate is supplied with a target exposure dose by irradiation with the pulsed light oscillated at substantially said rated maximum frequency.

80. A method for making a scanning exposure apparatus, said method comprising:
   providing a scanning system which moves a mask and a substrate synchronously to transfer a pattern of said mask onto said substrate, wherein said mask is moved in a first direction to expose one shot area on said substrate and said mask is moved in a second direction reverse to said first direction to expose another shot area on said substrate; and
   providing an exposure system, associated with said scanning system, which controls an exposure process, wherein said exposure process includes a first exposure operation for the exposure performed while moving said mask in said first direction and a second exposure operation, which is different from said first exposure operation, for the exposure performed while moving said mask in said second direction.

81. A method according to claim 80, wherein said exposure system is constructed to perform, during each of said exposures, an adjusting operation of an imaging characteristic of a pattern image projected onto said substrate.

82. A method according to claim 81, wherein a way of reading out said data is different between said exposure performed while moving said mask in said first direction and said exposure performed while moving said mask in said second direction.

83. A method according to claim 81, wherein said data comprises information regarding at least one of transmittance and reflectance of said mask.

84. A method according to claim 81, wherein said adjusting operation includes adjusting, during said exposures, an optical characteristic of a projection optical system which projects said pattern image onto said substrate.

85. A method according to claim 81, wherein a first way of using data to perform the adjusting operation for said exposure performed while moving said mask in said first direction is different from a second way of using said data to perform the adjusting operation for said exposure performed while moving said mask in said second direction.

86. A method according to claim 85, wherein said data includes data corresponding to a position of said mask or said substrate during said exposures.

87. A method according to claim 85, wherein said data includes data related to exposure beam energy incident on a projection optical system which projects said pattern image onto said substrate.

88. A scanning exposure method for transferring an image of a pattern of a mask onto a substrate while synchronously moving said mask and said substrate relative to a pulsed light that irradiates said mask, comprising:
   regulating a pulsed light source such that the pulsed light with which said mask is irradiated during the synchronous movement of said mask and said substrate oscillates substantially at a rated maximum frequency; and
   adjusting a width of an illumination area of said pulsed light in a mask movement direction such that said substrate is supplied with a target exposure dose by irradiation with the pulsed light oscillated at substantially said rated maximum frequency.

89. A method according to claim 88, further comprising:
   adjusting, during the synchronous movement of said mask and said substrate, an imaging characteristic of said image of the pattern of said mask.

90. A method according to claim 89, wherein said adjusting includes moving said mask relative to a projection system which projects said image of the pattern of said mask onto said substrate.

91. A scanning exposure apparatus in which a pattern of a mask is transferred onto a substrate, said apparatus comprising:
   a light source which emits pulsed light for scanning exposure;
   an optical device, disposed between said light source and said substrate, which adjusts a shape of an illumination area of the pulsed light; and
   an adjusting device, operatively connected with said light source and said optical device, which adjusts said light source such that the pulsed light oscillates substantially at a rated maximum frequency, and which adjusts a width of an illumination area of said pulsed light in a mask movement direction such that said substrate is supplied with a target exposure dose by irradiation with the pulsed light oscillated at substantially said rated maximum frequency.

92. An apparatus according to claim 91, further comprising:

an image control system which adjusts, during synchronous scanning movement of said mask and said substrate, an imaging characteristic of said image of the pattern of said mask.

93. An apparatus according to claim 92, wherein said image control system moves said mask relative to a projection system which projects said image of the pattern of said mask onto said substrate.

94. A method for making a scanning exposure apparatus in which a pattern of a mask transferred onto a substrate, said method comprising:

provifing a light source which emits pulsed light for scanning exposure;

providing an optical device, disposed between said light source and said substrate, which adjusts a shape of an illumination area of the pulsed light; and providing an adjusting device, operatively connected with said light source and said optical device, which adjusts said light source such that the pulsed light oscillates substantially at a rated maximum frequency, and which adjusts a width of an illumination area of said pulsed light in a mask movement direction such that said substrate is supplied with a target exposure done by irradiation with the pulsed light oscillated at substantially said rated maximum frequency.

95. A device manufacturing method including an exposure process in which an image of a device pattern formed an a mask is transferred onto a substrate while synchronously moving said mask and said substrate, the method comprising:

regulating a beam source such that pulses of an exposure beam to which said substrate is exposed through said mask are emitted substantially at a rated maximum frequency; and adjusting a width of an irradiation area of said exposure beam in a substrate scanning direction such that said substrate is supplied with a target exposure dose by irradiation with said pulses emitted from said beam source at substantially said rated maximum frequency.

* * * * *